United States Patent
Nemoto et al.

(10) Patent No.: US 12,265,331 B2
(45) Date of Patent: Apr. 1, 2025

(54) RADIATION-SENSITIVE RESIN COMPOSITION AND METHOD FOR FORMING RESIST PATTERN

(71) Applicant: JSR CORPORATION, Tokyo (JP)

(72) Inventors: Ryuichi Nemoto, Tokyo (JP); Kota Furuichi, Tokyo (JP); Hajime Inami, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/854,012

(22) Filed: Jun. 30, 2022

(65) Prior Publication Data

US 2022/0342307 A1 Oct. 27, 2022

Related U.S. Application Data

(63) Continuation-in-part of application No. PCT/JP2020/047968, filed on Dec. 22, 2020.

(30) Foreign Application Priority Data

Jan. 6, 2020 (JP) .................. 2020-000576

(51) Int. Cl.
*G03F 7/039* (2006.01)
*G03F 7/004* (2006.01)
*G03F 7/11* (2006.01)
*G03F 7/20* (2006.01)
*G03F 7/30* (2006.01)

(52) U.S. Cl.
CPC .......... *G03F 7/0397* (2013.01); *G03F 7/0048* (2013.01); *G03F 7/0392* (2013.01); *G03F 7/0395* (2013.01); *G03F 7/11* (2013.01); *G03F 7/2006* (2013.01); *G03F 7/30* (2013.01)

(58) Field of Classification Search
CPC ........ G03F 7/0392; G03F 7/0397; G03F 7/30; G03F 7/11
See application file for complete search history.

(56) References Cited

U.S. PATENT DOCUMENTS

9,488,914 B2 * 11/2016 Mori ............... G03F 7/2037

FOREIGN PATENT DOCUMENTS

| JP | 2004269412 A | 9/2004 |
| JP | 4073266 B2 | 4/2008 |
| TW | 200424771 A | 11/2004 |

OTHER PUBLICATIONS

English translation of the International Preliminary Report on Patentability and Written Opinion dated Jul. 12, 2022 in PCT/JP2020/047968, 5 pages.
International Search Report dated Mar. 23, 2021 in PCT/JP2020/047968, 3 pages.
Office Action issued Aug. 16, 2024 in corresponding Japanese Patent Application No. 2021-569821 (with English translation), 4 pages.
Combined Taiwanese Office Action and Search Report issued Feb. 29, 2024 in corresponding Taiwanese Patent Application No. 109143166 (with partial English translation), 10 pages.
Office Action issued Dec. 17, 2024, in corresponding Korean Patent Application No. 10-2022-7022666 (with machine English translation), 13 pages.
Office Action issued Jan. 23, 2025, in corresponding Japanese Patent Application No. 2021-569821 (with English translation), 5 pages.

* cited by examiner

*Primary Examiner* — John S Chu
(74) *Attorney, Agent, or Firm* — Element IP, PLC

(57) ABSTRACT

A radiation-sensitive resin composition includes: a resin including a structural unit (A) represented by formula (1) and a structural unit (B) having an acid-dissociable group; a radiation-sensitive acid generator; and a solvent. $R^1$ is a halogen atom-substituted or unsubstituted monovalent hydrocarbon group having 1 to 20 carbon atoms; X is —O— or —S—; $L^{a1}$ is a halogen atom-substituted or unsubstituted divalent hydrocarbon group having 1 to 10 carbon atoms, and $R^P$ is a monovalent organic group having at least one structure selected from the group consisting of a lactone structure, a cyclic carbonate structure, and a sultone structure.

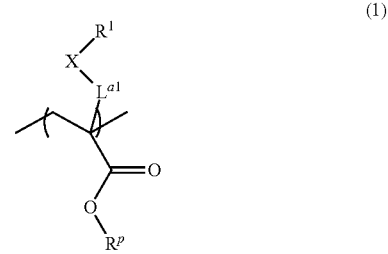

(1)

20 Claims, No Drawings

RADIATION-SENSITIVE RESIN COMPOSITION AND METHOD FOR FORMING RESIST PATTERN

CROSS-REFERENCE TO RELATED APPLICATIONS

The present application is a continuation-in-part application of International Application No. PCT/JP2020/047968, filed Dec. 22, 2020, which claims priority to Japanese Patent Application No. 2020-000576 filed Jan. 6, 2020. The contents of these applications are incorporated herein by reference in their entirety.

BACKGROUND OF THE INVENTION

Field of the Invention

The present invention relates to a radiation-sensitive resin composition and a method for forming a resist pattern.

Description of the Related Art

A photolithography technology using a resist composition has been used for the fine circuit formation in a semiconductor device. As the representative procedure, for example, a resist pattern is formed on a substrate by generating an acid by irradiating the coating of the resist composition with a radioactive ray through a mask pattern, and then reacting in the presence of the acid as a catalyst to generate the difference of solubility of a resin into an alkaline or organic developer between an exposed part and an unexposed part.

In the photolithography technique, the micronization of the pattern is promoted by using a short-wavelength radioactive ray such as an ArF excimer laser or by using an immersion exposure method (liquid immersion lithography) in which exposure is performed in a state in which a space between a lens of an exposure apparatus and a resist film is filled with a liquid medium. As a next-generation technology, lithography using shorter wavelength radiation such as electron beam, X-ray and EUV (extreme ultraviolet) is also being studied.

With the progress of exposure technology, a technique for achieving a pattern resolution from a micron unit to a submicron unit by using a resist composition containing a resin having an alicyclic group is being developed (see, JP-B-4073266).

SUMMARY OF THE INVENTION

According to an aspect of the present invention, a radiation-sensitive resin composition includes: a resin including a structural unit (A) represented by formula (1) and a structural unit (B) having an acid-dissociable group; a radiation-sensitive acid generator; and a solvent. $R^1$ is a halogen atom-substituted or unsubstituted monovalent hydrocarbon group having 1 to 20 carbon atoms; X is —O— or —S—; $L^{a1}$ is a halogen atom-substituted or unsubstituted divalent hydrocarbon group having 1 to 10 carbon atoms, and $R^P$ is a monovalent organic group having at least one structure selected from the group consisting of a lactone structure, a cyclic carbonate structure, and a sultone structure.

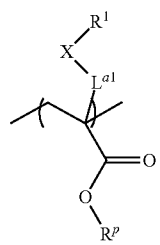
(1)

According to another aspect of the present invention, a method for forming a resist pattern, includes: forming a resist film from the above-described radiation-sensitive resin composition; exposing the resist film; and developing the exposed resist film

DESCRIPTION OF THE EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

In recent years, as miniaturization of resist patterns progresses, rectangularity of a resist pattern shape is required as well as line width roughness (LWR) performance and the like indicating variations in sensitivity and line width of a resist pattern, and further improvement in various resist performances is required. Furthermore, even in a next generation exposing technology such as electron beam exposure, various resist performances equivalent to or higher than those of an exposing technology using an ArF excimer laser are required.

An embodiment of the present invention relates to a radiation-sensitive resin composition containing:
  a resin containing a structural unit (A) represented by the following formula (1) and a structural unit (B) having an acid-dissociable group;
  a radiation-sensitive acid generator; and
  a solvent.

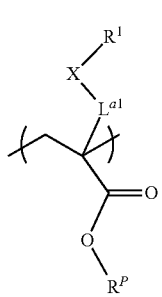
(1)

wherein

R[1] is a halogen atom-substituted or unsubstituted monovalent hydrocarbon group having 1 to 20 carbon atoms, X is —O— or —S—, L[a1] is a halogen atom-substituted or unsubstituted divalent hydrocarbon group having 1 to 10 carbon atoms, and R[P] is a monovalent organic group having at least one structure selected from the group consisting of a lactone structure, a cyclic carbonate structure, and a sultone structure.

The radiation-sensitive resin composition contains the resin having the structural unit (A) represented by the above formula (1) as one structural unit, and therefore a resist film using the composition can exhibit sensitivity, LWR performance, and resist pattern rectangularity at sufficient levels not only by exposure with an ArF excimer laser or the like but also by exposure with EUV (extreme ultraviolet rays) or the like. The reason for this is not bound by any theory, but can be expected as follows. At least one structure (hereinafter, also referred to as "lactone structure and the like") selected from the group consisting of a lactone structure, a cyclic carbonate structure, and a sultone structure of R[P] in the above formula (1) is ring-opened by the action of alkali to form a polar structure in an exposed part, to provide improved solubility of the resin in a developer. Meanwhile, in an unexposed part, the lactone structure or the like maintains hydrophobicity without being ring-opened, and due to the hydrophobicity of the hydrocarbon group represented by R[1], the entire structural unit (A) exhibits hydrophobicity, so that dissolution of the resin in the developer can be suppressed. As described above, it is presumed that an effect of improving the solubility of the resin in the developer in the exposed part and an effect of suppressing the dissolution of the resin in the developer in the unexposed part synergize with each other to improve dissolution contrast therebetween, thereby improving the rectangularity of a pattern. It is to be noted that the organic group refers to a group containing at least one carbon atom.

Another embodiment of the present invention relates to a method for forming a resist pattern including:

forming a resist film from the radiation-sensitive resin composition;

exposing the resist film; and developing the exposed resist film.

The forming method uses the above-described radiation-sensitive resin composition excellent in various resist performances, and therefore a high-quality resist pattern can efficiently be formed. Hereinafter, the embodiments of the present invention will be explained in detail.

<Radiation-Sensitive Resin Composition>

A radiation-sensitive resin composition according to the present embodiment (hereinafter, also simply referred to as a "composition") contains a resin, a radiation-sensitive acid generator, and a solvent. The composition may contain another optional component as long as the effects of the present invention are not impaired.

[Resin]

(Structural Unit (A))

The resin is an assembly of polymers that contain a structural unit (A) represented by the following formula (1) and a structural unit (B) having an acid-dissociable group (hereinafter, this resin will also be referred to as a "base resin").

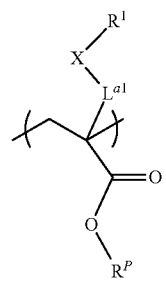

(1)

In the above formula (1),

R[1] is a halogen atom-substituted or unsubstituted monovalent hydrocarbon group having 1 to 20 carbon atoms.

X is —O— or —S—.

L[a1] is a halogen atom-substituted or unsubstituted divalent hydrocarbon group having 1 to 10 carbon atoms.

R[P] is a monovalent organic group having at least one structure selected from the group consisting of a lactone structure, a cyclic carbonate structure, and a sultone structure.

The radiation-sensitive resin composition is excellent in sensitivity, LWR performance, and pattern rectangularity because the resin contains the structural unit (A).

Examples of the monovalent hydrocarbon group having 1 to 20 carbon atoms represented by R[1] include chain hydrocarbon groups having 1 to 20 carbon atoms, monovalent alicyclic hydrocarbon groups having 3 to 20 carbon atoms, monovalent aromatic hydrocarbon groups having 6 to 20 carbon atoms, or combinations thereof.

Examples of the chain hydrocarbon groups having 1 to 20 carbon atoms represented by R[1] include a linear or branched saturated hydrocarbon group having 1 to 20 carbon atoms and a linear or branched unsaturated hydrocarbon group having 1 to 20 carbon atoms.

Examples of the alicyclic hydrocarbon groups having 3 to 20 carbon atoms represented by R[1] include monocyclic or polycyclic saturated hydrocarbon groups and monocyclic or polycyclic unsaturated hydrocarbon groups. Preferred examples of the monocyclic saturated hydrocarbon groups include a cyclopentyl group, a cyclohexyl group, a cycloheptyl group, and a cyclooctyl group. Preferred examples of the polycyclic cycloalkyl groups include bridged alicyclic hydrocarbon groups such as a norbornyl group, an adamantyl group, a tricyclodecyl group, and a tetracyclododecyl group. It is to be noted that the bridged alicyclic hydrocarbon group refers to a polycyclic alicyclic hydrocarbon group in which two carbon atoms that constitute an alicyclic ring and not adjacent to each other are bonded by a bonding chain containing at least one carbon atom.

Examples of the monovalent aromatic hydrocarbon groups having 6 to 20 carbon atoms represented by R[1] include: aryl groups such as a phenyl group, a tolyl group, a xylyl group, a naphthyl group, and an anthryl group; and aralkyl groups such as a benzyl group, a phenethyl group, and a naphthylmethyl group.

A part or all of hydrogen atoms of the monovalent hydrocarbon group having 1 to 20 carbon atoms represented by R[1] may be substituted with a halogen atom such as a fluorine atom, a chlorine atom, a bromine atom, or an iodine atom. Of course, a part or all of the hydrogen atoms may not be substituted with any halogen atom.

The monovalent hydrocarbon group having 1 to 20 carbon atoms represented by $R^1$ preferably does not contain a hetero atom (excluding the halogen atom) such as an oxygen atom or a sulfur atom. Thereby, by suppressing the occurrence of polarization and polarity in $R^1$, hydrophobicity of the structural unit (A) in the unexposed part can be maintained, and excellent pattern rectangularity can be exhibited.

Suitable examples of the divalent hydrocarbon group having 1 to 10 carbon atoms represented by $L^{a1}$ include a group obtained by further removing one hydrogen atom from a group having 1 to 10 carbon atoms out of the monovalent hydrocarbon group having 1 to 20 carbon atoms represented by $R^1$.

Among them, $L^{a1}$ is preferably a divalent chain hydrocarbon group, and particularly preferably a methylene group from the viewpoint of balance between hydrophobicity of the structural unit (A) in the exposed part and hydrophilicity due to the generation of a polar structure, and copolymerizability between a monomer that provides the structural unit (A) and another monomer, and the like.

The organic group represented by $R^P$ is not particularly limited as long as it has at least one structure selected from the group consisting of a lactone structure, a cyclic carbonate structure, and a sultone structure. The organic group may be a chain structure, a cyclic structure, or a combination thereof. Examples of the chain structure include chain hydrocarbon groups that may either be saturated or unsaturated and linear or branched. Examples of the cyclic structure include cyclic hydrocarbon groups that may be alicyclic, aromatic, or heterocyclic. Other examples of the organic group include a group obtained by substituting a part or all of hydrogen atoms contained in a group having a chain structure or a group having a cyclic structure by a substituent and a group containing, between carbon atoms of such a group, CO, CS, O, S, $SO_2$, or NR' or a combination of two or more of them.

Examples of the substituent that substitutes part or all of the hydrogen atoms of the organic group include halogen atoms such as a fluorine atom, a chlorine atom, a bromine atom, and an iodine atom; a hydroxy group; a carboxy group; a cyano group; a nitro group; an alkyl group, an alkoxy group, an alkoxycarbonyl group, an alkoxycarbonyloxy group, an acyl group, an acyloxy group, or a group in which a hydrogen atom of these groups has been substituted with a halogen atom; and an oxo group (=O).

$R^P$ in the above formula (1) is preferably represented by the following formula (A).

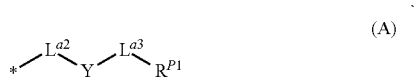

(A)

In the above formula (A),
$L^{a2}$ is a single bond or a substituted or unsubstituted divalent hydrocarbon group having 1 to 10 carbon atoms,
Y is a single bond or a divalent linking group selected from —O—, —CO—, —NH—, —$SO_2$—, or a combination thereof,
$L^{a3}$ is a single bond or a substituted or unsubstituted divalent hydrocarbon group having 1 to 10 carbon atoms,
$R^{P1}$ is a substituted or unsubstituted lactone structure, a cyclic carbonate structure, or a sultone structure, and
* is a bond with —O— in the above formula (1).

Examples of the divalent hydrocarbon group having 1 to 10 carbon atoms represented by $L^{a2}$ and $L^{a3}$ include groups similar to the divalent hydrocarbon group having 1 to 10 carbon atoms represented by $L^{a1}$. Examples of the substituent capable of substituting a part or all of the hydrogen atoms contained in the hydrocarbon group include the above-described substituents. Another examples thereof include a group containing, between carbon atoms of such a group, CO, CS, O, S, $SO_2$, or NR' or a combination of two or more of them.

Examples of the lactone structure, cyclic carbonate structure, and sultone structure represented by $R^{P1}$ include structures represented by the following formulas (A-1) to (A-15).

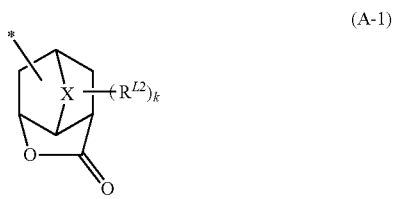

(A-1)

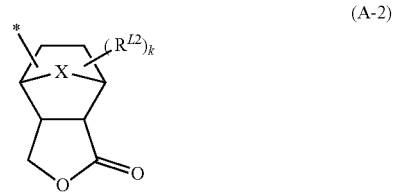

(A-2)

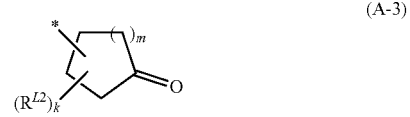

(A-3)

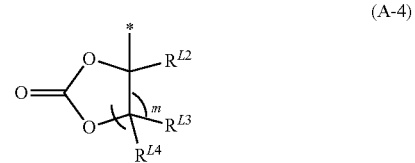

(A-4)

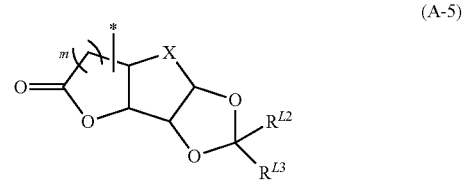

(A-5)

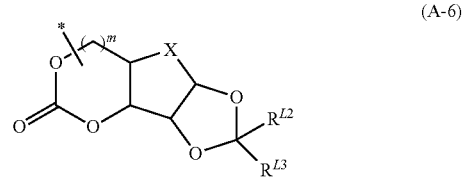

(A-6)

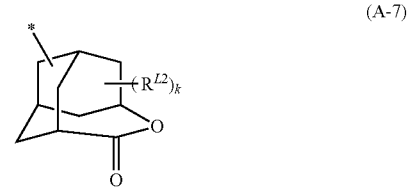

(A-7)

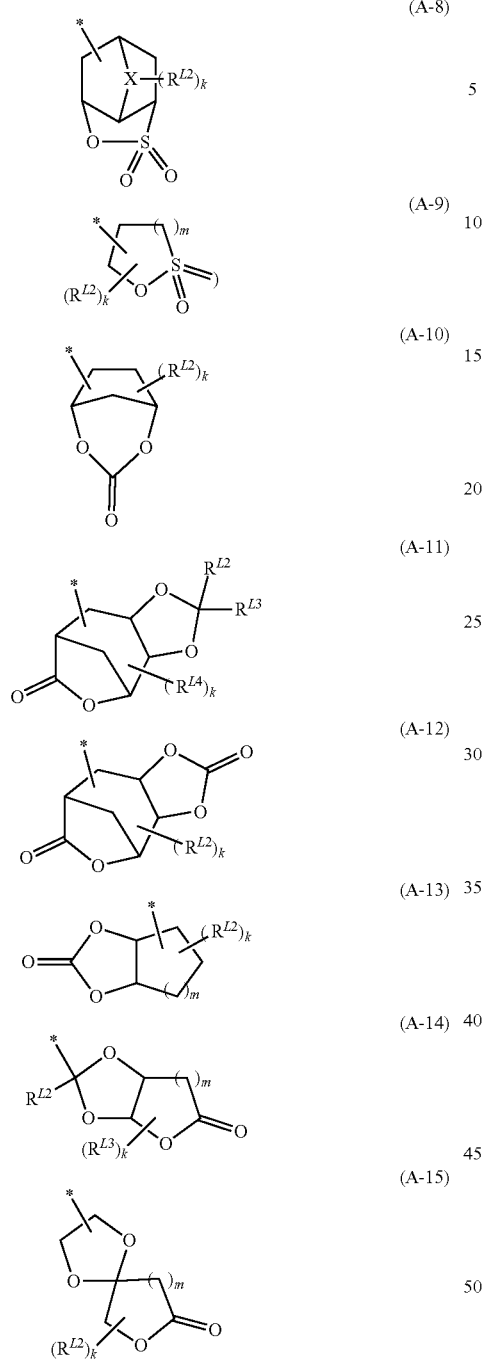

In the above formula, $R^{L2}$ to $R^{L4}$ each independently represent a hydrogen atom, a halogen atom, an alkyl group having 1 to 4 carbon atoms, a cyano group, a trifluoromethyl group, a methoxy group, a methoxycarbonyl group, a hydroxy group, a hydroxymethyl group, or a dimethylamino group. When a plurality of $R^{L2}$ to $R^{L4}$ are present, the plurality of $R^{L2}$ to $R^{L4}$ may be the same or different from each other. X is an oxygen atom or a methylene group. k is an integer of 0 to 3. m is an integer of 1 to 3. is a bond with -$L^{a3}$- in the above formula (A).

Specific examples of the structural unit (A) include structural units represented by the following formulas (1-1) to (1-20).

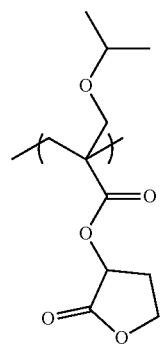
(1-1)

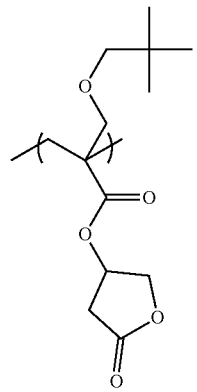
(1-2)

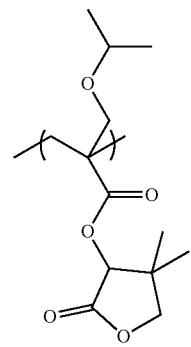
(1-3)

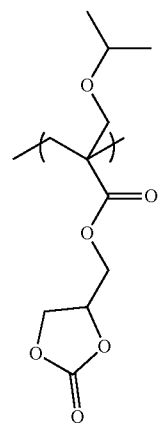
(1-4)

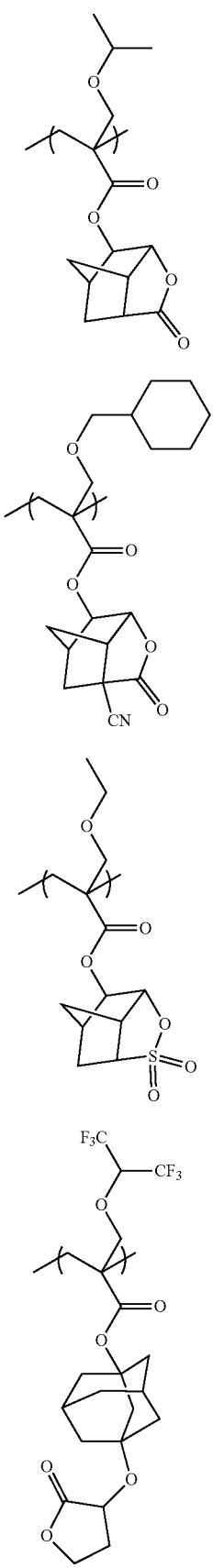
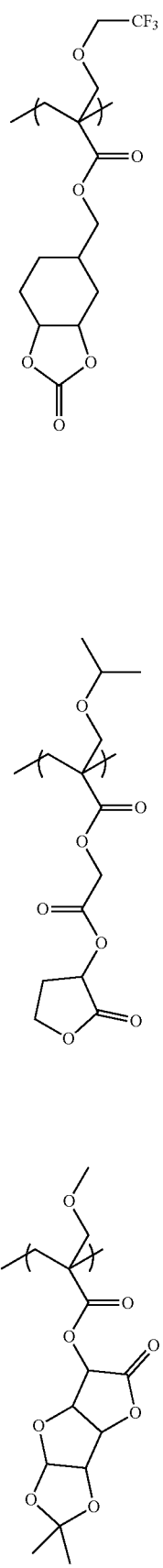

(1-12)
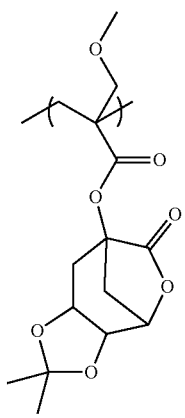
(1-13)
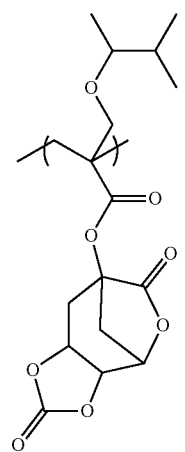
(1-14)
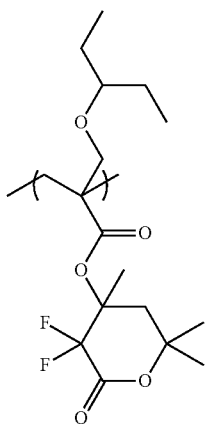
(1-15)
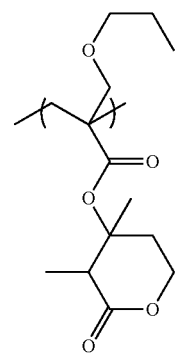
(1-16)
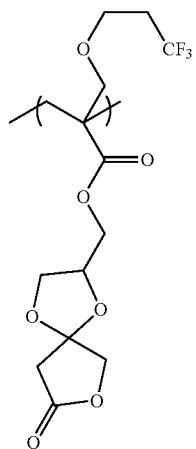
(1-17)
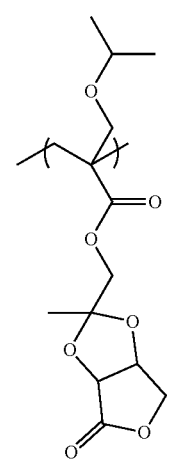
(1-18)
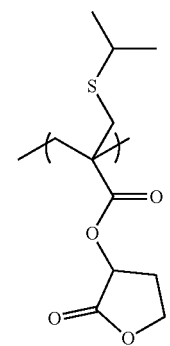

(1-19)

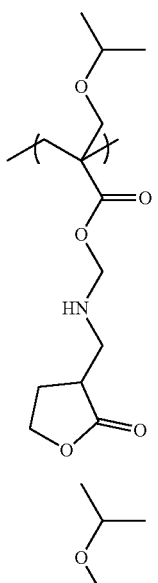

(1-20)

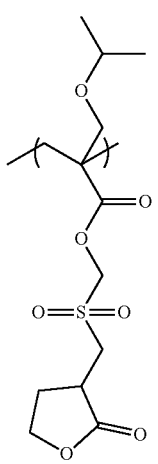

The base resin may contain one or a combination of two or more of the structural units (A).

The lower limit of the content by percent of the structural unit (A) (the total content by percent when a plurality of structural units (A) are contained) is preferably 5 mol %, more preferably 6 mol %, still more preferably 8 mol %, and particularly preferably 10 mol % based on the total structural units as the component of the base resin. The upper limit of the content by percent is preferably 80 mol %, more preferably 70 mol %, still more preferably 65 mol %, and particularly preferably 60 mol %. By adjusting the content by percent of the structural unit (A) within the ranges, the sensitivity, LWR performance, and pattern rectangularity of the resist film obtained from the radiation-sensitive resin composition can be further improved.

(Method for Synthesizing Monomer that Gives Structural Unit (A))

The monomer that gives the structural unit (A) can be synthesized, for example, according to the following scheme. In the above formula (1), a case where X is an oxygen atom will be described below as an example.

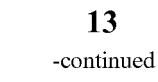

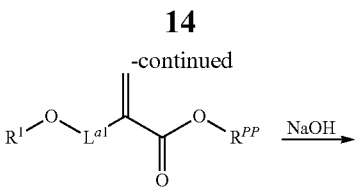

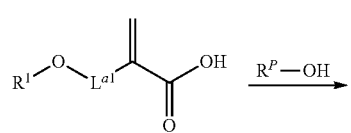

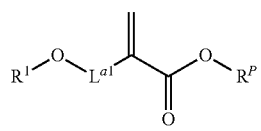

(1')

(In the above scheme, E is a halogen atom. $R^1$, $L^{a1}$, and $R^P$ have the same meanings as those in the above formula (1).)

A halogenated raw material in which an ester moiety is protected is reacted with an alcohol having a structure corresponding to $R^1$ in the above formula (1) to produce an ether derivative. Then, deprotection is performed by alkaline hydrolysis, and finally an alcohol having a structure corresponding to $R^P$ in the above formula (1) is reacted to synthesize a monomer that gives a structural unit (A) represented by formula (1'). Other structures can also be synthesized by appropriately changing a linking group of a starting material, an alcohol having a structure of $R^1$, and an alcohol having a structure of $R^P$, and the like.

In addition to the structural unit (A), the base resin preferably has a structural unit (hereinafter, also referred to as "structural unit (B)") containing an acid-dissociable group and a structural unit (C) containing at least one selected from the group consisting of a lactone structure, a cyclic carbonate structure, and a sultone structure described later, and may have another structural unit other than the structural units (B) and (C). The "acid-dissociable group" refers to a group that substitutes for a hydrogen atom of a carboxy group, a phenolic hydroxyl group, an alcoholic hydroxyl group, a sulfo group, or the like, and is dissociated by the action of an acid. The radiation-sensitive resin composition is excellent in pattern-forming performance because the resin has the structural unit (B). Each of the structural units will be described below.

[Structural Unit (A)]

The structural unit (A) is a structural unit containing an acid-dissociable group. The structural unit (B) is not particularly limited as long as it contains an acid-dissociable group. Examples of such a structural unit (I) include a structural unit having a tertiary alkyl ester moiety, a structural unit having a structure obtained by substituting the hydrogen atom of a phenolic hydroxyl group with a tertiary alkyl group, and a structural unit having an acetal bond. From the viewpoint of improving the pattern-forming performance of the radiation-sensitive resin composition, a structural unit represented by the following formula (2) (hereinafter also referred to as a "structural unit (B-1)") is preferred.

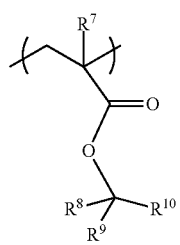

(2)

(In the above formula (2), $R^7$ is a hydrogen atom, a fluorine atom, a methyl group, or a trifluoromethyl group, $R^8$ is a a monovalent hydrocarbon group having 1 to 20 carbon atoms, $R^9$ and $R^{19}$ are each independently a monovalent chain hydrocarbon group having 1 to 10 carbon atoms or a monovalent alicyclic hydrocarbon group having 3 to 20 carbon atoms or represent a divalent alicyclic group having 3 to 20 carbon atoms formed by these groups combined together and a carbon atom to which they are bonded.

From the viewpoint of copolymerizability of a monomer that will give the structural unit (I-1), $R^7$ is preferably a hydrogen atom or a methyl group, more preferably a methyl group.

Examples of the monovalent hydrocarbon group having 1 to 20 carbon atoms represented by $R^8$ include a chain hydrocarbon group having 1 to 10 carbon atoms, a monovalent alicyclic hydrocarbon group having 3 to 20 carbon atoms, and a monovalent aromatic hydrocarbon group having 6 to 20 carbon atoms.

Examples of the chain hydrocarbon groups having 1 to 10 carbon atoms represented by $R^8$ to $R^{10}$ include linear or branched saturated hydrocarbon groups having 1 to 10 carbon atoms and linear or branched unsaturated hydrocarbon groups having 1 to 10 carbon atoms.

Examples of the alicyclic hydrocarbon groups having 3 to 20 carbon atoms represented by $R^8$ to $R^{10}$ include monocyclic or polycyclic saturated hydrocarbon groups and monocyclic or polycyclic unsaturated hydrocarbon groups. Preferred examples of the monocyclic saturated hydrocarbon groups include a cyclopentyl group, a cyclohexyl group, a cycloheptyl group, and a cyclooctyl group. Preferred examples of the polycyclic saturated hydrocarbon groups include bridged alicyclic hydrocarbon groups such as a norbornyl group, an adamantyl group, a tricyclodecyl group, and a tetracyclododecyl group. It is to be noted that the bridged alicyclic hydrocarbon group refers to a polycyclic alicyclic hydrocarbon group in which two carbon atoms that constitute an alicyclic ring and not adjacent to each other are bonded by a bonding chain containing at least one carbon atom.

Examples of the monovalent aromatic hydrocarbon group having 6 to 20 carbon atoms represented by $R^8$ include: aryl groups such as a phenyl group, a tolyl group, a xylyl group, a naphthyl group, and an anthryl group; and aralkyl groups such as a benzyl group, a phenethyl group, and a naphthylmethyl group.

$R^8$ is preferably a linear or branched saturated hydrocarbon group having 1 to 10 carbon atoms or an alicyclic hydrocarbon group having 3 to 20 carbon atoms.

The divalent alicyclic group having 3 to 20 carbon atoms formed by $R^9$ and $R^{10}$ combined together and a carbon atom to which a chain hydrocarbon group or an alicyclic hydrocarbon group represented by $R^9$ and a chain hydrocarbon group or an alicyclic hydrocarbon group represented by $R^{10}$ are bonded is not particularly limited as long as it is a group obtained by removing two hydrogen atoms from the same carbon atom constituting a carbon ring of a monocyclic or polycyclic alicyclic hydrocarbon having the above-described carbon number. The divalent alicyclic group having 3 to 20 carbon atoms may either be a monocyclic hydrocarbon group or a polycyclic hydrocarbon group. The polycyclic hydrocarbon group may either be a bridged alicyclic hydrocarbon group or a condensed alicyclic hydrocarbon group and may either be a saturated hydrocarbon group or an unsaturated hydrocarbon group. It is to be noted that the condensed alicyclic hydrocarbon group refers to a polycyclic alicyclic hydrocarbon group in which two or more alicyclic rings share their sides (bond between two adjacent carbon atoms).

When the monocyclic alicyclic hydrocarbon group is a saturated hydrocarbon group, preferred examples thereof include a cyclopentanediyl group, a cyclohexanediyl group, a cycloheptanediyl group, and a cyclooctanediyl group. When the monocyclic alicyclic hydrocarbon group is an unsaturated hydrocarbon group, preferred examples thereof include a cyclopentenediyl group, a cyclohexenediyl group, a cycloheptenediyl group, a cyclooctenediyl group, and a cyclodecenediyl group. The polycyclic alicyclic hydrocarbon group is preferably a bridged alicyclic saturated hydrocarbon group, and preferred examples thereof include a bicyclo[2.2.1]heptane-2,2-diyl group (norbornane-2,2-diyl group), a bicyclo[2.2.2]octane-2,2-diyl group, and a tricyclo[3.3.1.1$^{3,7}$]decane-2,2-diyl group (adamantane-2,2-diyl group).

Among them, $R^8$ is preferably an alkyl group having 1 to 4 carbon atoms, and the alicyclic structure formed by $R^9$ and $R^{10}$ combined together and a carbon atom to which they are bonded is preferably a polycyclic or monocyclic cycloalkane structure.

Examples of the structural unit (B-1) include structural units represented by the following formulas (3-1) to (3-6) (hereinafter also referred to as "structural units (B-1-1) to (B-1-6)").

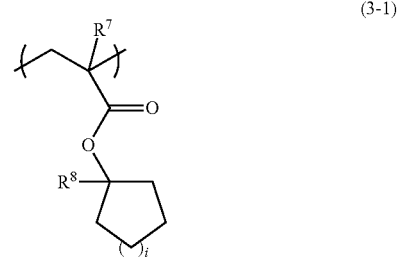

(3-1)

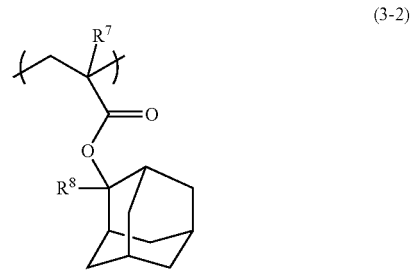

(3-2)

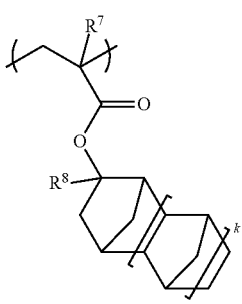

(3-3)

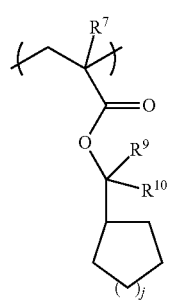

(3-4)

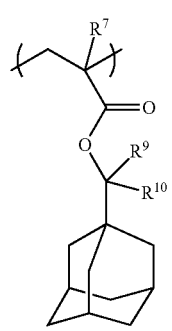

(3-5)

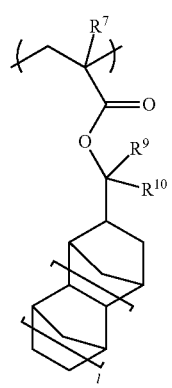

(3-6)

In the above formulas (3-1) to (3-6), $R^7$ to $R^{10}$ have the same meaning as in the above formula (2), i and j are each independently an integer of 1 to 4, and k and 1 are each 0 or 1.

In the above formulas (3-1) to (3-6), i and j are preferably 1, and $R^8$ is preferably a methyl group, an ethyl group, or an isopropyl group. $R^9$ and $R^{18}$ are each preferably a methyl group, or an ethyl group The base resin may contain one type or a combination of two or more types of the structural units (B).

The lower limit of the content (total content, if multiple types are included) of the structural unit (B) is preferably 10 mol %, more preferably 20 mol %, even more preferably 25 mol % with respect to the total amount of the structural units constituting the base resin. The upper limit of the content is preferably 90 mol %, more preferably 80 mol %, even more preferably 75 mol %, particularly preferably 70 mol %. When the content of the structural unit (B) is set to fall within the above range, the pattern-forming performance of the radiation-sensitive resin composition can further be improved.

[Structural Unit (C)]

The structural unit (C) is a structural unit including at least one selected from the group consisting of a lactone structure, a cyclic carbonate structure and a sultone structure (excluding those corresponding to the structural unit (A)). The solubility of the base resin into a developer can be adjusted by further introducing the structural unit (C). As a result, the radiation-sensitive resin composition can provide improved lithography properties such as the resolution. The adhesion between a resist pattern formed from the base resin and a substrate can also be improved.

Examples of the structural unit (C) include structural units represented by the following formulae (T-1) to (T-10).

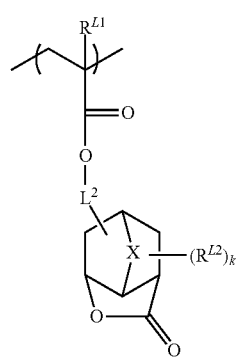

(T-1)

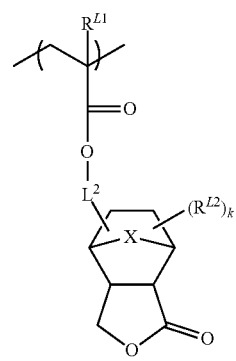

(T-2)

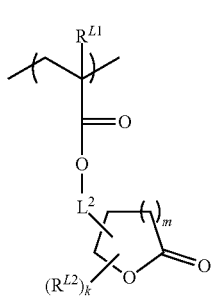

(T-3)

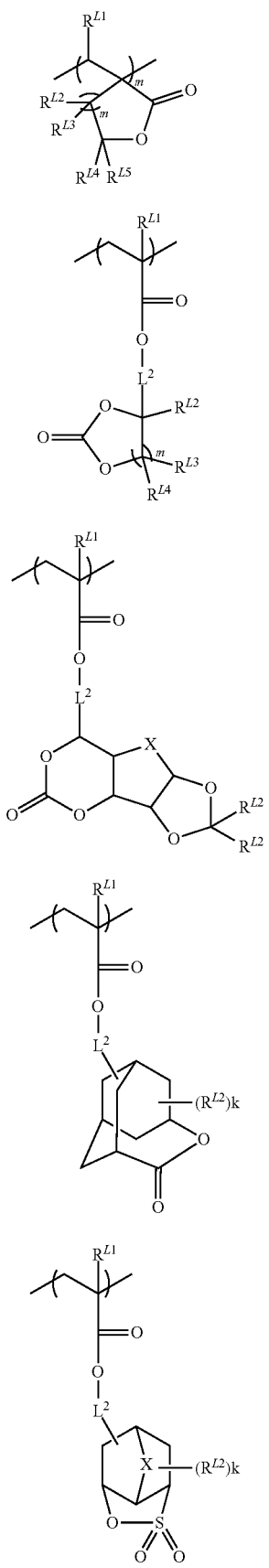
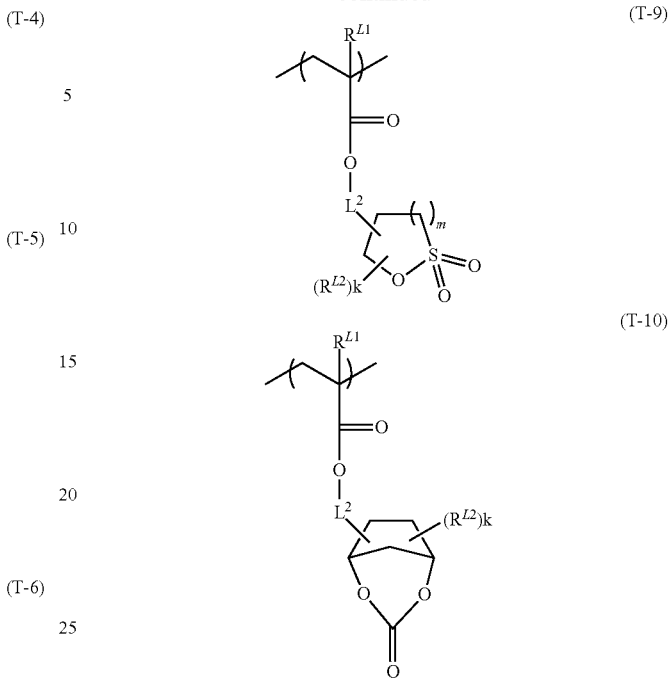

In the above formulae, $R^{L1}$ is a hydrogen atom, a fluorine atom, a methyl group, or a trifluoromethyl group; $R^{L2}$ to $R^{L5}$ are each independently a hydrogen atom, an alkyl group having a carbon number of 1 to 4, a cyano group, a trifluoromethyl group, a methoxy group, a methoxycarbonyl group, a hydroxy group, a hydroxymethyl group, or a dimethylamino group; $R^{L4}$ and $R^{L5}$ may be a divalent alicyclic group having a carbon number of 3 to 8, which is obtained by combining $R^{L4}$ and $R^{L5}$ with the carbon atom to which they are bound. $L^2$ is a single bond, or a divalent linking group; X is an oxygen atom or a methylene group; k is an integer of 0 to 3; and m is an integer of 1 to 3.

Example of the divalent alicyclic group having a carbon number of 3 to 8, which is composed of a combination of $R^{L4}$ and $R^{L5}$ with the carbon atom to which they are bound, includes the divalent alicyclic group having a carbon number of 3 to 8 in the divalent alicyclic group having a carbon number of 3 to 20, which is composed of a combination of the chain hydrocarbon group or the alicyclic hydrocarbon group represented by $R^9$ and $R^{10}$ in the above formula (2) with the carbon atom to which they are bound. One or more hydrogen atoms on the alicyclic group may be substituted with a hydroxy group.

Examples of the divalent linking group represented by $L^2$ as described above include a divalent straight or branched chain hydrocarbon group having a carbon number of 1 to 10; a divalent alicyclic hydrocarbon group having a carbon number of 4 to 12; and a group composed of one or more of the hydrocarbon group thereof and at least one group of —CO—, —O—, —NH— and —S—.

Among them, the structural unit (C) is preferably a group having a lactone structure, more preferably a group having a norbornane lactone structure, and further preferably a group derived from a norbornane lactone-yl (meth)acrylate.

The lower limit of the content by percent of the structural unit (C) is preferably 2 mol %, more preferably 4 mol %, and further preferably 5 mol % based on the total structural units as the component of the base resin. The upper limit of the content by percent is preferably 50 mol %, more preferably 45 mol %, and further preferably 40 mol %. By adjusting the content by percent of the structural unit D within the ranges, the radiation-sensitive resin composition can provide improved lithography properties such as the resolution. The adhesion between the formed resist pattern and the substrate can also be improved.

[Structural Unit (D)]

The base resin optionally may have another structural unit in addition to the structural units (B) and (C). Another structural unit includes a structural unit (D) including a polar group (excluding those corresponding to the structural unit (C)). When the base resin further has a structural unit (D) including a polar group, solubility in the developer can be adjusted. As a result, lithographic performance such as resolution of the radiation-sensitive resin composition can be improved. Examples of the polar group include a hydroxy group, a carboxy group, a cyano group, a nitro group, and a sulfonamide group. Among them, a hydroxy group and a carboxy group are preferable, and a hydroxy group is more preferable.

Examples of the structural unit (D) including a polar group include structural units represented by the following formulas.

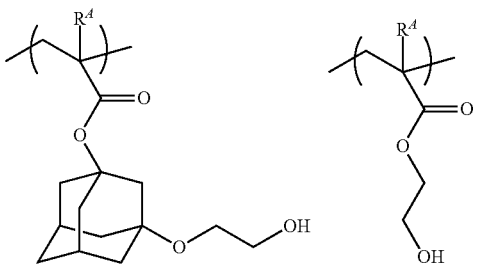

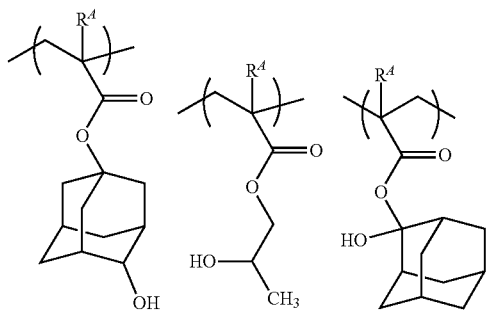

-continued

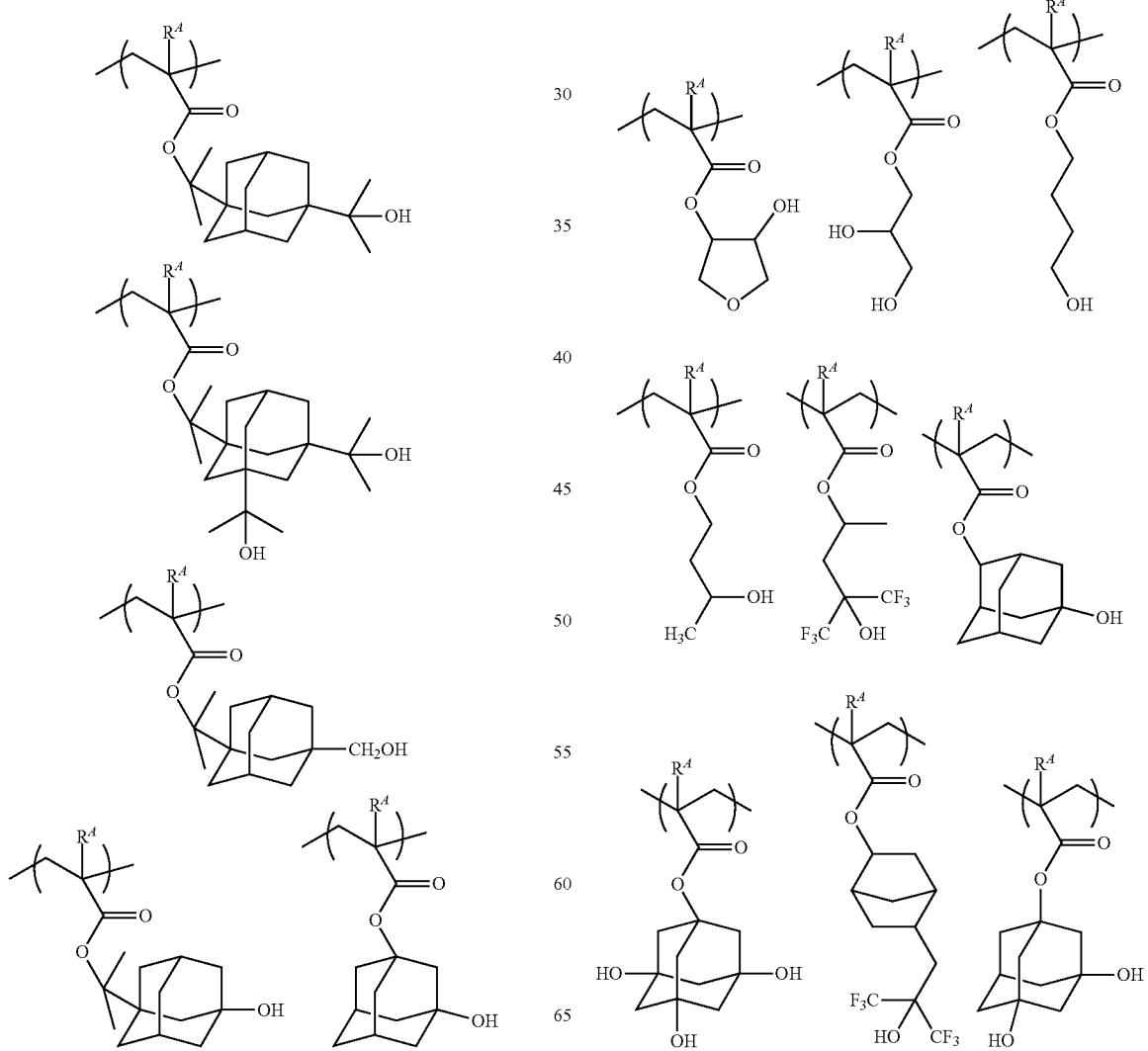

-continued

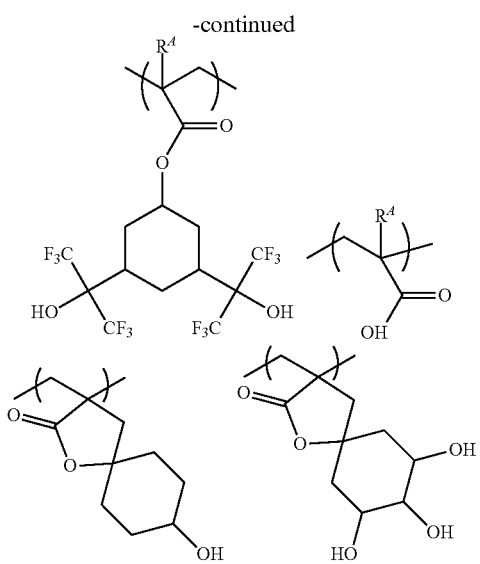

In the above formulas, RA is a hydrogen atom, a fluorine atom, a methyl group, or a trifluoromethyl group.

When the resin includes the structural unit (D) including a polar group, the lower limit of the content of the structural unit (D) including a polar group with respect to the total amount of the structural units constituting the resin is preferably 2 mol %, more preferably 5 mol %, even more preferably 8 mol %. The upper limit of the content is preferably 40 mol %, more preferably 30 mol %, even more preferably 20 mol %. When the content of the structural unit (D) including a polar group is set to fall within the above range, the radiation-sensitive resin composition can provide further improved lithography properties such as the resolution.

[Structural Unit (E)]

The base resin may have, as another structural unit, a structural unit having a phenolic hydroxyl group (hereinafter, referred to as "structural unit (E)"), in addition to the structural unit (D) including a polar group. The structural unit (E) contributes to an improvement in etching resistance and an improvement in a difference in solubility of a developer (dissolution contrast) between an exposed part and an unexposed part. In particular, the structural unit (E) can be suitably applied to pattern formation using exposure with a radioactive ray having a wavelength of 50 nm or less, such as an electron beam or EUV. In this case, the resin preferably has the structural unit (B) together with the structural unit (E).

Examples of the structural unit (E) include a structural unit represented by the following formula (af).

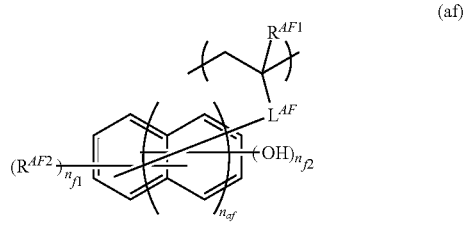

(af)

In the above formula (af), $R^{AF1}$ is a hydrogen atom or a methyl group. $L^{AF}$ is a single bond, —COO—, —O—, or —CONH—. $R^{AF2}$ is a monovalent organic group having 1 to 20 carbon atoms or a halogen atom. $n_{f1}$ is an integer of 0 to 3. When $n_{f1}$ is 2 or 3, a plurality of $R^{AF2}$s may be the same or different. $n_{f2}$ is an integer of 1 to 3. However, $n_{f1}+n_{f2}$ is 5 or less. $n_{af}$ is an integer of 0 to 2.

The $R^{AF1}$ is preferably a hydrogen atom from the viewpoint of the copolymerizability of a monomer giving the structural unit (E).

$L^{AF}$ is preferably a single bond and —COO—.

The organic group in the base resin refers to a group containing at least one carbon atom.

Examples of the monovalent organic group having 1 to 20 carbon atoms, represented by $R^{AF2}$ include a monovalent hydrocarbon group having 1 to 20 carbon atoms, a group containing a divalent hetero atom-containing group between two adjacent carbon atoms or at the end of the atomic bonding side of the hydrocarbon group, and a group obtained by substituting with a monovalent hetero atom-containing group, a part or all of hydrogen atoms contained in the group and the hydrocarbon group.

Examples of the monovalent hydrocarbon group having 1 to 20 carbon atoms, represented by $R^{AF2}$ include: alkyl groups such as a methyl group, an ethyl group, a propyl group, and a butyl group;

alkenyl groups such as an ethenyl group, a propenyl group, and a butenyl group;

chain hydrocarbon groups such as alkynyl groups (such as an ethynyl group, a propynyl group, and a butynyl group);

cycloalkyl groups such as a cyclopropyl group, a cyclopentyl group, a cyclohexyl group, a cyclooctyl group, a norbornyl group, and an adamantyl group;

alicyclic hydrocarbon groups such as cycloalkenyl groups (such as a cyclopropenyl group, a cyclopentenyl group, a cyclohexenyl group, and a norbornenyl group);

aryl groups such as a phenyl group, a tolyl group, a xylyl group, a naphthyl group, and an anthryl group; and aromatic hydrocarbon groups such as aralkyl groups (such as a benzyl group, a phenethyl group, and a naphthylmethyl group).

The $R^{AF2}$ is preferably a chain hydrocarbon group or a cycloalkyl group, more preferably an alkyl group and a cycloalkyl group, and still more preferably a methyl group, an ethyl group, a propyl group, a cyclopentyl group, a cyclohexyl group, a cyclooctyl group, and an adamantyl group.

Examples of the divalent heteroatom-containing group include —O—, —CO—, —OO—O—, —S—, —CS—, —SO$_2$—, —NR'—, and a group obtained by combining two or more of these. Suitable examples of the divalent heteroatom-containing group include a methoxy group, an ethoxy group, and a propoxy group. R' is a hydrogen atom or a monovalent hydrocarbon group.

Examples of the monovalent heteroatom-containing group include halogen atoms such as a fluorine atom, a chlorine atom, a bromine atom, and an iodine atom, a hydroxy group, a carboxy group, a cyano group, an amino group, and a sulfanyl group (—SH).

Examples of the halogen atom include a fluorine atom, a chlorine atom, a bromine atom, and an iodine atom.

The $n_{f1}$ is preferably an integer of 0 to 2, more preferably 0 and 1, and still more preferably 0.

The $n_{f2}$ is preferably 1 and 2, and more preferably 1.

The $n_{af}$ is preferably 0 and 1, and more preferably 0.

The structural unit (E) is preferably a structural unit represented by each of the following formulae (a1-1) to (a1-9), or the like.

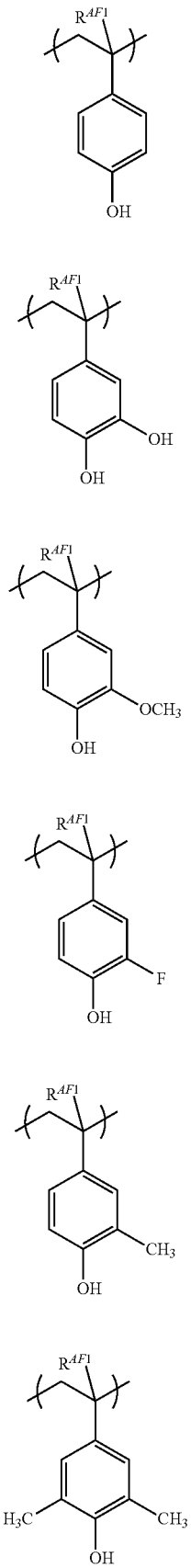

(a1-1)
(a1-2)
(a1-3)
(a1-4)
(a1-5)
(a1-6)

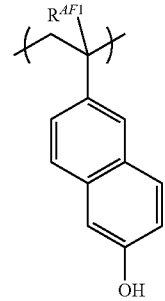

(a1-7)

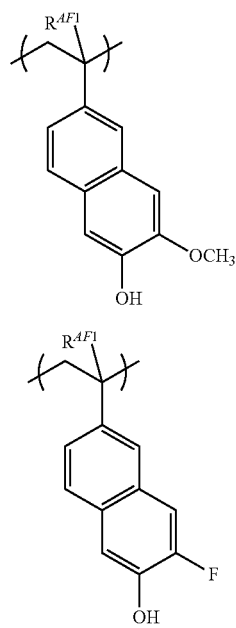

(a1-8)

(a1-9)

In the above formulae (a1-1) to (a1-9), $R^{AF1}$ is the same as that in the above formula (af).

Among them, the structural units represented by the above formulae (a1-1) to (a1-7) are preferable, and the structural unit represented by the above formula (a1-1) is more preferable.

When the base resin includes the structural unit (E), the lower limit of the content ratio of the structural unit (E) in the base resin is preferably 5 mol %, more preferably 10 mol %, still more preferably 15 mol % with respect to the total structural units constituting the base resin. The upper limit of the content ratio is preferably 50 mol %, more preferably 40 mol %, and still more preferably 30 mol %. By setting the content ratio of the structural unit (E) within the above range, the sensitivity, LWR performance, and pattern rectangularity of the resist film obtained from the radiation-sensitive resin composition can be further improved.

However, the polymerization of the hydroxystyrene is inhibited by the effect of its phenolic hydroxide group. Therefore, hydroxystyrene is polymerized in a state that the phenolic hydroxide group is preferably protected with a protecting group such as an alkali-dissociable group, and then hydrolyzed for the deprotection of the phenolic hydroxide group to obtain the structural unit (E). The structural unit from which the structural unit (E) is obtained by the hydrolysis is preferably represented by the following formula (af-1).

(af-1)

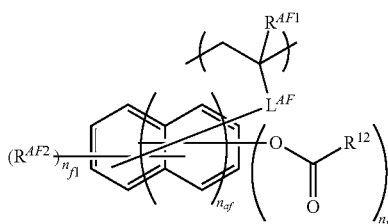

In the above formula (af-1), $R^{AF1}$, $L^{AF}$, $R^{AF2}$, $n_{f1}$, $n_{f2}$ and $n_{af}$ have the same meanings as those in the above formula (af); $R^{12}$ is a monovalent hydrocarbon group having a carbon number of 1 to 20, or an alkoxy group. Example of the monovalent hydrocarbon group having a carbon number of 1 to 20 of $R^{12}$ includes the monovalent hydrocarbon group having a carbon number of 1 to 20 of $R^8$ in the structural unit (B). Examples of the alkoxy group include a methoxy group, an ethoxy group and a tert-butoxy group.

Preferred $R^{12}$ is an alkyl group and an alkoxy group. A methyl group or a tert-butoxy group is more preferred.

The fluorine content in the base resin is preferably 10% by mass or less. The upper limit of the fluorine content is more preferably 9% by mass, further preferably 8% by mass, and particularly preferably 7% by mass. The lower limit of the fluorine content is preferably 0% by mass (that is, the base resin does not contain a fluorine atom). By setting the fluorine content in the base resin within the above range, the dissolution contrast between the exposed portion and the unexposed portion can be improved, and desired resist performance can be exhibited.

(Synthesis Method of Base Resin)

For example, the base resin can be synthesized by performing a polymerization reaction of each monomer for providing each structural unit with a radical polymerization initiator or the like in a suitable solvent.

Examples of the radical polymerization initiator include an azo-based radical initiator, including azobisisobutyronitrile (AIBN), 2,2'-azobis(4-methoxy-2,4-dimethylvaleronitrile), 2,2'-azobis(2-cyclopropylpropanenitrile), 2,2'-azobis(2,4-dimethylvaleronitrile), and dimethyl 2,2'-azobisisobutyrate; and peroxide-based radical initiator, including benzoyl peroxide, t-butyl hydroperoxide, and cumene hydroperoxide. Among them, AIBN or dimethyl 2,2'-azobisisobutyrate is preferred, and AIBN is more preferred. The radical initiator may be used alone, or two or more radical initiators may be used in combination.

Examples of the solvent used for the polymerization reaction include alkanes including n-pentane, n-hexane, n-heptane, n-octane, n-nonane, and n-decane;

cycloalkanes including cyclohexane, cycloheptane, cyclooctane, decalin, and norbornane;

aromatic hydrocarbons including benzene, toluene, xylene, ethylbenzene, and cumene;

halogenated hydrocarbons including chlorobutanes, bromohexanes, dichloroethanes, hexamethylenedibromide, and chlorobenzenes;

saturated carboxylate esters, including ethyl acetate, n-butyl acetate, i-butyl acetate, and methyl propionate;

ketones including acetone, methyl ethylketone, 4-methyl-2-pentanone, and 2-heptanone;

ethers including tetrahydrofuran, dimethoxyethanes, and diethoxyethanes; and alcohols including methanol, ethanol, 1-propanol, 2-propanol, and 4-methyl-2-pentanol. The solvent used for the polymerization reaction may be used alone, or two or more solvents may be used in combination.

The reaction temperature of the polymerization reaction is typically from 40° C. to 150° C., and preferably from 50° C. to 120° C. The reaction time is typically from 1 hour to 48 hours, and preferably from 1 hour to 24 hours.

The molecular weight of the base resin is not particularly limited, but the polystyrene-equivalent weight average molecular weight (Mw) measured by gel permeation chromatography (GPC) is preferably 1,000 or more and 50,000 or less, more preferably 2,000 or more and 30,000 or less, still more preferably 3,000 or more and 15,000 or less, particularly preferably 4,000 or more and 12,000 or less. When the Mw of the base resin is less than the lower limit, the heat resistance of the resulting resist film may be deteriorated. When the Mw of the base resin exceeds the above upper limit, the developability of the resist film may be deteriorated.

For the base resin as a base resin, the ratio of Mw to the number average molecular weight (Mn) as determined by GPC relative to standard polystyrene (Mw/Mn) is typically not less than 1 and not more than 5, preferably not less than 1 and not more than 3, and more preferably not less than 1 and not more than 2.

The Mw and Mn of the resin in the specification are amounts measured by using Gel Permeation Chromatography (GPC) with the condition as described below.

GPC column: two G2000HXL, one G3000HXL, and one G4000HXL (all manufactured from Tosoh Corporation)

Column temperature: 40° C.

Eluting solvent: tetrahydrofuran

Flow rate: 1.0 mL/min

Sample concentration: 1.0% by mass

Sample injection amount: 100 µL

Detector: Differential Refractometer

Reference material: monodisperse polystyrene

The content of the base resin is preferably not less than 70% by mass, more preferably not less than 80% by mass, and further preferably not less than 85% by mass based on the total solid content of the radiation-sensitive resin composition.

<Another Resin>

The radiation-sensitive resin composition according to the present embodiment may contain, as another resin, a resin having higher content by mass of fluorine atoms than the above-described base resin (hereinafter, also referred to as a "high fluorine-content resin"). When the radiation-sensitive resin composition contains the high fluorine-content resin, the high fluorine-content resin can be localized in the surface layer of a resist film compared to the base resin, which as a result makes it possible to enhance the water repellency of the surface of the resist film during immersion exposure.

The high fluorine-content resin preferably has, for example, a structural unit represented by the following formula (5) (hereinafter, also referred to as "structural unit (F)"), as well as at least one of the structural unit (B) and the structural unit (C) in the base resin.

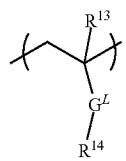

(5)

In the above formula (5), $R^{13}$ is a hydrogen atom, a methyl group, or a trifluoromethyl group; $G^L$ is a single bond, an oxygen atom, a sulfur atom, —COO—, —SO$_2$ONH—, —CONH—, or —OCONH—; $R^{14}$ is a monovalent fluorinated chain hydrocarbon group having a carbon number of 1 to 20, or a monovalent fluorinated alicyclic hydrocarbon group having a carbon number of 3 to 20.

As $R^{13}$ as described above, in terms of the copolymerizability of monomers resulting in the structural unit (F), a hydrogen atom or a methyl group is preferred, and a methyl group is more preferred.

As $G^L$ as described above, in terms of the copolymerizability of monomers resulting in the structural unit (F), a single bond or —COO— is preferred, and —COO— is more preferred.

Example of the monovalent fluorinated chain hydrocarbon group having a carbon number of 1 to 20 represented by $R^{14}$ as described above includes a group in which a part of or all of hydrogen atoms in the straight or branched chain alkyl group having a carbon number of 1 to 20 is/are substituted with a fluorine atom.

Example of the monovalent fluorinated alicyclic hydrocarbon group having a carbon number of 3 to 20 represented by $R^{14}$ as described above includes a group in which a part of or all of hydrogen atoms in the monocyclic or polycyclic hydrocarbon group having a carbon number of 3 to 20 is/are substituted with a fluorine atom.

The $R^{14}$ as described above is preferably a fluorinated chain hydrocarbon group, more preferably a fluorinated alkyl group, and further preferably 2,2,2-trifluoroethyl group, 1,1,1,3,3,3-hexafluoropropyl group and 5,5,5-trifluoro-1,1-diethylpentyl group.

When the high fluorine-content resin has the structural unit (F), the lower limit of the content of the structural unit (F) is preferably 20 mol %, more preferably 30 mol %, even more preferably 35 mol % with respect to the total amount of all the structural units constituting the high fluorine-content resin. The upper limit of the content is preferably 95 mol %, more preferably 90 mol %, even more preferably 85 mol %. When the content of the structural unit (F) is set to fall within the above range, the content by mass of fluorine atoms of the high fluorine-content resin can more appropriately be adjusted to further promote the localization of the high fluorine-content resin in the surface layer of a resist film, as a result, the water repellency of the resist film during immersion exposure can be further improved.

The high fluorine-content resin may have a fluorine atom-containing structural unit represented by the following formula (f-2) (hereinafter, also referred to as a "structural unit (G)") other than the structural unit (F). When the high fluorine-content resin has the structural unit (G), solubility in an alkaline developing solution is improved, and therefore generation of development defects can be prevented.

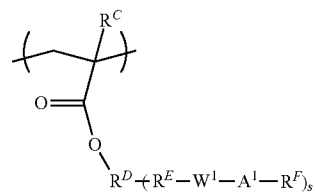

(f-2)

The structural unit (G) is classified into two groups: a unit having an alkali soluble group (x); and a unit having a group (y) in which the solubility into the alkaline developing solution is increased by the dissociation by alkali (hereinafter, simply referred as an "alkali-dissociable group"). In both cases of (x) and (y), $R^C$ in the above formula (f-2) is a hydrogen atom, a fluorine atom, a methyl group, or a trifluoromethyl group; RD is a single bond, a hydrocarbon group having a carbon number of 1 to 20 with the valency of (s+1), a structure in which an oxygen atom, a sulfur atom, —NR$^{dd}$—, a carbonyl group, —COO— or —CONH— is connected to the terminal on $R^E$ side of the hydrocarbon group, or a structure in which a part of hydrogen atoms in the hydrocarbon group is substituted with an organic group having a hetero atom; $R^{dd}$ is a hydrogen atom, or a monovalent hydrocarbon group having a carbon number of 1 to 10; and s is an integer of 1 to 3.

When the structural unit (G) has the alkali soluble group (x), $R^F$ is a hydrogen atom; $A^1$ is an oxygen atom, —COO—* or —SO$_2$O—*; * refers to a bond to $R^F$; $W^1$ is a single bond, a hydrocarbon group having a carbon number of 1 to 20, or a divalent fluorinated hydrocarbon group. When $A^1$ is an oxygen atom, $W^1$ is a fluorinated hydrocarbon group having a fluorine atom or a fluoroalkyl group on the carbon atom connecting to $A^1$. $R^E$ is a single bond, or a divalent organic group having a carbon number of 1 to 20. When s is 2 or 3, a plurality of $R^E$, $W^1$, $A^1$ and $R^F$ may be each identical or different. The affinity of the high fluorine-content resin into the alkaline developing solution can be improved by including the structural unit (G) having the alkali soluble group (x), and thereby prevent from generating the development defect. As the structural unit (G) having the alkali soluble group (x), particularly preferred is a structural unit in which $A^1$ is an oxygen atom and $W^1$ is a 1,1,1,3,3,3-hexafluoro-2,2-methanediyl group.

When the structural unit (G) has the alkali-dissociable group (y), $R^F$ is a monovalent organic group having carbon number of 1 to 30; $A^1$ is an oxygen atom, —NR$^{aa}$—, —COO—*, or —SO$_2$O—*; $R^{aa}$ is a hydrogen atom, or a monovalent hydrocarbon group having a carbon number of 1 to 10; * refers to a bond to $R^F$; $W^1$ is a single bond, or a divalent fluorinated hydrocarbon group having a carbon number of 1 to 20; $R^E$ is a single bond, or a divalent organic group having a carbon number of 1 to 20. When $A^1$ is —COO—* or —SO$_2$O—*, $W^1$ or $R^F$ has a fluorine atom on the carbon atom connecting to $A^1$ or on the carbon atom adjacent to the carbon atom. When $A^1$ is an oxygen atom, $W^1$ and $R^E$ are a single bond; RD is a structure in which a carbonyl group is connected at the terminal on $R^E$ side of the hydrocarbon group having a carbon number of 1 to 20; and $R^F$ is an organic group having a fluorine atom. When s is 2 or 3, a plurality of $R^E$, $W^1$, $A^1$ and $R^F$ may be each identical or different. The surface of the resist film is changed from hydrophobic to hydrophilic in the alkaline developing step by including the structural unit (G) having the alkali-dissociable group (y). As a result, the affinity of the high fluorine-content resin into the alkaline developing solution can be significantly improved, and thereby prevent from generating the development defect more efficiently. As the structural unit (G) having the alkali-dissociable group (y), particularly preferred is a structural unit in which $A^1$ is —COO—*, and $R^F$ or $W^1$, or both is/are a fluorine atom.

In terms of the copolymerizability of monomers resulting in the structural unit (G), $R^C$ is preferably a hydrogen atom or a methyl group, and more preferably a methyl group.

When $R^E$ is a divalent organic group, $R^E$ is preferably a group having a lactone structure, more preferably a group having a polycyclic lactone structure, and further preferably a group having a norbornane lactone structure.

When the high fluorine-content resin has the structural unit (G), the lower limit of the content of the structural unit (G) is preferably 40 mol %, more preferably 50 mol %, even more preferably 60 mol %, particularly preferably 70 mol % with respect to the total amount of all the structural units constituting the high fluorine-content resin. The upper limit of the content is preferably 98 mol %, more preferably 95 mol %, even more preferably 92 mol %. When the content of the structural unit (G) is set to fall within the above range, water repellency of a resist film during immersion exposure can further be improved.

The lower limit of Mw of the high fluorine-content resin is preferably 1,000, more preferably 2,000, further preferably 3,000, and particularly preferably 5,000. The upper limit of Mw is preferably 50,000, more preferably 30,000, further preferably 20,000, and particularly preferably 15,000.

The lower limit of the Mw/Mn of the high fluorine-content resin is typically 1, and more preferably 1.1. The upper limit of the Mw/Mn is typically 5, preferably 3, more preferably 2, and further preferably 1.9.

The lower limit of the content of the high fluorine-content resin is preferably 0.1 part by mass, more preferably 1 part by mass, further preferably 1.5 part by mass, and particularly preferably 2 parts by mass based on 100 parts by mass of total base resins. The upper limit of the content is preferably 15 parts by mass, more preferably 12 parts by mass, further preferably 10 parts by mass, and particularly preferably 8 parts by mass.

When the content of the high fluorine-content resin is set to fall within the above range, the high fluorine-content resin can more effectively be localized in the surface layer of a resist film, which as a result makes it possible to further enhance the water repellency of the surface of the resist film during liquid immersion lithography. The radiation-sensitive resin composition may contain one kind of high fluorine-content resin or two or more kinds of high fluorine-content resins.

(Method for Synthesizing High Fluorine-Content Resin)

The high fluorine-content resin can be synthesized by a method similar to the above-described method for synthesizing a base resin.

<Radiation-Sensitive Acid Generator>

The radiation-sensitive acid generator is a component that generates an acid by exposure. The acid generated by exposure is considered to have two functions in the radiation-sensitive resin composition depending on the strength of the acid. Examples of the first function include a function that causes the acid generated by exposure to dissociate an acid dissociable group of a structural unit (B) when the resin contains the structural unit (B) having the acid dissociable group, to generate a carboxy group or the like. The radiation-sensitive acid generator having the first function is referred to as a radiation-sensitive acid generator (I). Examples of the second function include a function that suppresses the diffusion of the acid generated from the radiation-sensitive acid generator (I) in the unexposed part without substantially dissociating the acid dissociable group of the structural unit (B) of the resin under a pattern formation condition using the radiation-sensitive resin composition. The radiation-sensitive acid generator having the second function is referred to as a radiation-sensitive acid generator (II). The acid generated from the radiation-sensitive acid generator (II) can be said to be relatively weaker (acid having a larger pKa) than the acid generated from the radiation-sensitive acid generator (I). Whether the radiation-sensitive acid generator functions as the radiation-sensitive acid generator (I) or (II) depends on energy required for the dissociation of the acid-dissociable group of the structural unit (B) or the like of the resin, and heat energy conditions applied when a pattern is formed using the radiation-sensitive resin composition, and the like. The containing mode of the radiation-sensitive acid generator in the radiation-sensitive resin composition may be a mode in which the radiation-sensitive acid generator is present alone as a compound (released from a polymer), a mode in which the radiation-sensitive acid generator is incorporated as a part of a polymer, or both of these forms, but a mode in which the radiation-sensitive acid generator is present alone as a compound is preferable.

When the radiation-sensitive resin composition contains the radiation-sensitive acid generator (I), the polarity of the resin in the exposed part increases, whereby the resin in the exposed part is soluble in the developer in the case of alkaline aqueous solution development, and is poorly soluble in the developer in the case of organic solvent development.

By containing the radiation-sensitive acid generator (II), the radiation-sensitive resin composition can form a resist pattern having better pattern developability, LWR performance and CDU performance.

Examples of the radiation-sensitive acid generator include an onium salt compound, a sulfonimide compound, a halogen-containing compound, and a diazoketone compound.

Examples of the onium salt compound include a sulfonium salt, a tetrahydrothiophenium salt, an iodonium salt, a phosphonium salt, a diazonium salt, and a pyridinium salt. Among them, a sulfonium salt and an iodonium salt are preferable.

Examples of the acid generated by exposure include acids that generate sulfonic acid, carboxylic acid, and sulfonimide by exposure. Examples of such an acid include (1) a compound in which a carbon atom adjacent to a sulfo group is substituted with one or more fluorine atoms or fluorinated hydrocarbon groups, and (2) a compound in which a carbon atom adjacent to a sulfo group is not substituted with a fluorine atom or a fluorinated hydrocarbon group. Examples of the carboxylic acid generated by exposure include (3) a compound in which a carbon atom adjacent to a carboxy group is substituted with one or more fluorine atoms or fluorinated hydrocarbon groups, and (4) a compound in which a carbon atom adjacent to a carboxy group is not substituted with a fluorine atom or a fluorinated hydrocarbon group. Among them, as the radiation-sensitive acid generator (I), a radiation-sensitive acid generator corresponding to the above (1) is preferable, and a radiation-sensitive acid generator having a cyclic structure is particularly preferable. As the radiation-sensitive acid generator (II), a radiation-sensitive acid generator corresponding to the above (2), (3), or (4) is preferable, and a radiation-sensitive acid generator corresponding to the above (2) or (4) is particularly preferable.

These radiation-sensitive acid generators may be used alone or in combination of two or more thereof. The lower limit of the content of the radiation-sensitive acid generator (I) is preferably 2 parts by mass, more preferably 5 parts by mass, and still more preferably 8 parts by mass, with respect to 100 parts by mass of the resin, from the viewpoint of securing sensitivity and developability as a resist. The upper limit of the content of the radiation-sensitive acid generator (I) is preferably 30 parts by mass, more preferably 25 parts by mass, and still more preferably 20 parts by mass, with respect to 100 parts by mass of the resin, from the viewpoint of securing transparency to radiation.

<Solvent>

The radiation-sensitive resin composition contains a solvent. The solvent is not particularly limited as long as it can dissolve or disperse at least the resin, the radiation-sensitive acid generator, and an acid diffusion controlling agent or the like contained if necessary.

Examples of the solvent include an alcohol-based solvent, an ether-based solvent, a ketone-based solvent, an amide-based solvent, an ester-based solvent, and a hydrocarbon-based solvent.

Examples of the alcohol-based solvent include:

a monoalcohol-based solvent having a carbon number of 1 to 18, including iso-propanol, 4-methyl-2-pentanol, 3-methoxybutanol, n-hexanol, 2-ethylhexanol, furfuryl alcohol, cyclohexanol, 3,3,5-trimethylcyclohexanol, and diacetone alcohol;

a polyhydric alcohol having a carbon number of 2 to 18, including ethylene glycol, 1,2-propylene glycol, 2-methyl-2,4-pentanediol, 2,5-hexanediol, diethylene glycol, dipropylene glycol, triethylene glycol, and tripropylene glycol; and a partially etherized polyhydric alcohol-based solvent in which a part of hydroxy groups in the polyhydric alcohol-based solvent is etherized.

Examples of the ether-based solvent include:

a dialkyl ether-based solvent, including diethyl ether, dipropyl ether, and dibutyl ether;

a cyclic ether-based solvent, including tetrahydrofuran and tetrahydropyran;

an ether-based solvent having an aromatic ring, including diphenylether and anisole (methyl phenyl ether); and an etherized polyhydric alcohol-based solvent in which a hydroxy group in the polyhydric alcohol-based solvent is etherized.

Examples of the ketone-based solvent include:

a chain ketone-based solvent, including acetone, butanone, and methyl-iso-butyl ketone;

a cyclic ketone-based solvent, including cyclopentanone, cyclohexanone, and methylcyclohexanone; and 2,4-pentanedione, acetonylacetone, and acetophenone.

Examples of the amide-based solvent include:

a cyclic amide-based solvent, including N,N'-dimethyl imidazolidinone and N-methylpyrrolidone; and a chain amide-based solvent, including N-methylformamide, N,N-dimethylformamide, N,N-diethylformamide, acetamide, N-methylacetamide, N,N-dimethylacetamide, and N-methylpropionamide.

Examples of the ester-based solvent include:

a monocarboxylate ester-based solvent, including n-butyl acetate and ethyl lactate;

a partially etherized polyhydric alcohol acetate-based solvent, including diethylene glycol mono-n-butyl ether acetate, propylene glycol monomethyl ether acetate, and dipropylene glycol monomethyl ether acetate;

a lactone-based solvent, including γ-butyrolactone and valerolactone;

a carbonate-based solvent, including diethyl carbonate, ethylene carbonate, and propylene carbonate; and a polyhydric carboxylic acid diester-based solvent, including propylene glycol diacetate, methoxy triglycol acetate, diethyl oxalate, ethyl acetoacetate, ethyl lactate, and diethyl phthalate.

Examples of the hydrocarbon-based solvent include:

an aliphatic hydrocarbon-based solvent, including n-hexane, cyclohexane, and methylcyclohexane;

an aromatic hydrocarbon-based solvent, including benzene, toluene, di-iso-propylbenzene, and n-amylnaphthalene.

Among them, the ester-based solvent or the ketone-based solvent is preferred. The partially etherized polyhydric alcohol acetate-based solvent, the cyclic ketone-based solvent, or the lactone-based solvent is more preferred. Propylene glycol monomethyl ether acetate, cyclohexanone, or γ-butyrolactone is still more preferred. The radiation-sensitive resin composition may include one type of the solvent, or two or more types of the solvents in combination.

<Other Optional Components>

The radiation-sensitive resin composition may contain other optional components other than the above-descried components. Examples of other optional components include an acid diffusion controlling agent, a localization enhancing agent, a surfactant, an alicyclic backbone-containing compound, and a sensitizer. These other optional components may be used singly or in combination of two or more of them.

(Acid Diffusion Controlling Agent)

If necessary, the radiation-sensitive resin composition may contain an acid diffusion controlling agent. As the acid diffusion controlling agent, the radiation-sensitive acid generating agent (II) can be suitably employed among the radiation-sensitive acid generating agents. The acid diffusion controlling agent has the effect of controlling a diffusion phenomenon of an acid generated from the radiation-sensitive acid generator by exposure in a resist film to prevent an undesired chemical reaction in an unexposed area. The storage stability of the resulting radiation-sensitive resin composition is improved. The resolution of a resist pattern is further improved, the line width change of a resist pattern due to variation in post exposure delay time between exposure and development treatment can be prevented, and a radiation-sensitive resin composition excellent in process stability can be obtained.

The lower limit of the content of the acid diffusion controlling agent is preferably 1 part by mass, more preferably 2 parts by mass, and still more preferably 4 part by mass with respect to a total of 100 parts by mass of the radiation-sensitive acid generator. The upper limit of the content is preferably 20 parts by mass, more preferably 15 parts by mass, and still more preferably 10 parts by mass.

When the content of the acid diffusion controlling agent is set to fall within the above range, the lithography performance of the radiation-sensitive resin composition can further be improved. The radiation-sensitive resin composition may contain one or two or more kinds of acid diffusion controlling agents.

(Localization Enhancing Agent)

The localization enhancing agent has an effect of localizing the high fluorine-content resin on the surface of the resist film more effectively. The added amount of the high fluorine-content resin can be decreased compared to the traditionally added amount by including the localization enhancing agent in the radiation-sensitive resin composition. The localization enhancing agent can further prevent from eluting the ingredient of the composition from the resist film to an immersion medium and carry out the immersion exposure at higher speed with a high-speed scan, while maintaining the lithography properties of the radiation-sensitive resin composition. As a result, the hydrophobicity of the surface of the resist film can be improved, resulting in the prevention of the defect due to the immersion, for example, the watermark defect. Example of the compound which may be used as the localization enhancing agent includes a low molecular weight compound having a specific dielectric constant of not less than 30 and not more than 200 and a boiling point of 100° C. or more at 1 atm. Specific examples of the compound include a lactone compound, a carbonate compound, a nitrile compound, and a polyhydric alcohol.

Examples of the lactone compound include γ-butyrolactone, valerolactone, mevaloniclactone, and norbornane lactone.

Examples of the carbonate compound include propylene carbonate, ethylene carbonate, butylene carbonate, and vinylene carbonate.

Example of the nitrile compound includes succinonitrile.

Example of the polyhydric alcohol includes glycerine.

The lower limit of the content of the localization enhancing agent is preferably 10 parts by mass, more preferably 15 parts by mass, further preferably 20 parts by mass, and more further preferably 25 parts by mass based on 100 parts by mass of total resins in the radiation-sensitive resin composition. The upper limit of the content is preferably 300 parts by mass, more preferably 200 parts by mass, further preferably 100 parts by mass, and more further preferably 80 parts by mass. The radiation-sensitive resin composition may include one type of the localization enhancing agent, or two or more types of localization enhancing agents in combination.

(Surfactant)

The surfactant has an effect of improving the coating properties, the striation, and the developability of the composition. Examples of the surfactant include a nonionic surfactant, including polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate. Examples of the surfactant which is commercially available include KP341 (manufactured by Shin-Etsu Chemical Co., Ltd.), POLYFLOW No. 75, POLYFLOW No. 95 (all manufactured by Kyoeisha Chemical Co., Ltd.), EFTOP EF301, EFTOP EF303, EFTOP EF352 (all manufactured by Tokem Products), Megafac F171, Megafac F173 (all manufactured by DIC), Fluorad FC430, Fluorad FC431 (all manufactured by Sumitomo 3M Limited.), AsahiGuard AG710, Surflon S-382, Surflon SC-101, Surflon SC-102, Surflon SC-103, Surflon SC-104, Surflon SC-105, Surflon SC-106 (all manufactured by Asahi Glass Co., Ltd.). The content of the surfactant in the radiation-sensitive resin composition is typically not more than 2 parts by mass based on 100 parts by mass of total resins.

(Alicyclic Backbone-Containing Compound)

The alicyclic backbone-containing compound has an effect of improving the dry etching resistance, the shape of the pattern, the adhesiveness between the substrate, and the like.

Examples of the alicyclic backbone-containing compound include:

adamantane derivatives, including 1-adamantane carboxylic acid, 2-adamantanone, and t-butyl 1-adamantane carboxylate;

deoxycholic acid esters, including t-butyl deoxycholate, t-butoxycarbonylmethyl deoxycholate, and 2-ethoxyethyl deoxycholate;

lithocholic acid esters, including t-butyl lithocholate, t-butoxycarbonylmethyl lithocholate, and 2-ethoxyethyl lithocholate; and 3-[2-hydroxy-2,2-bis(trifluoromethyl)ethyl]tetracyclo [4.4.0.1(2,5).1(7,10)]dode cane, and 2-hydroxy-9-methoxycarbonyl-5-oxo-4-oxa-tricyclo[4.2.1.0(3,7)] nonane. The content of the alicyclic backbone-containing compound in the radiation-sensitive resin composition is typically not more than 5 parts by mass based on 100 parts by mass of total resins.

(Sensitizer)

The sensitizer shows an action of increasing the production of the acid, for example, from the radiation-sensitive acid generator, and has an effect of improving the "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, and phenothiazines. The sensitizer may be used alone, or two or more sensitizers may be used in combination. The content of the sensitizer in the radiation-sensitive resin composition is typically not more than 2 parts by mass based on 100 parts by mass of total resins.

<Method for Preparing Radiation-Sensitive Resin Composition>

The radiation-sensitive resin composition can be prepared by, for example, mixing the resin, the radiation-sensitive acid generator, and optionally acid diffusion controlling agent, the high fluorine-content resin, as well as the solvent added in a predetermined ratio. The radiation-sensitive resin composition is preferably filtered through, for example, a filter having a pore diameter of about 0.05 μm to 0.20 μm after mixing. The solid matter concentration of the radiation-sensitive resin composition is usually 0.1 mass % to 50 mass %, preferably 0.5 mass % to 30 mass %, more preferably 1 mass % to 20 mass %.

<Method for Forming Resist Pattern>

A pattern forming method according to the present embodiment includes:

forming a resist film (hereinafter, also referred to as a "resist film forming step") from the radiation-sensitive resin composition;

exposing the resist film (hereinafter, also referred to as an "exposure step"); and developing the exposed resist film (hereinafter, also referred to as a "developing step").

The method for forming a resist pattern may include providing an upper film on the resist film after forming the resist film and before exposing the resist film (hereinafter, also referred to as an "upper film forming step").

The method for forming a pattern uses the above-described radiation-sensitive resin composition, and therefore a high-quality resist pattern excellent in sensitivity, LWR performance and pattern rectangularity can be formed. Hereinbelow, each of the steps will be described.

[Resist Film Forming Step]

In this step (the above mentioned step (1)), a resist film is formed with the radiation-sensitive resin composition. Examples of the substrate on which the resist film is formed include one traditionally known in the art, including a silicon wafer, silicon dioxide, and a wafer coated with aluminum. An organic or inorganic antireflection film may be formed on the substrate, as disclosed in JP-B-06-12452 and JP-A-59-93448. Examples of the applicating method include a rotary coating (spin coating), flow casting, and roll coating. After applicating, a prebake (PB) may be carried out in order to evaporate the solvent in the film, if needed. The temperature of PB is typically from 60° C. to 140° C., and preferably from 80° C. to 120° C. The duration of PB is typically from 5 seconds to 600 seconds, and preferably from 10 seconds to 300 seconds. The thickness of the resist film formed is preferably from 10 nm to 1,000 nm, and more preferably from 10 nm to 500 nm.

When the immersion exposure is carried out, irrespective of presence of a water repellent polymer additive such as the high fluorine-content resin in the radiation-sensitive resin composition, the formed resist film may have a protective film for the immersion which is not soluble into the immersion liquid on the film in order to prevent a direct contact between the immersion liquid and the resist film. As the protective film for the immersion, a solvent-removable protective film that is removed with a solvent before the developing step (for example, see JP-A-2006-227632); or a developer-removable protective film that is removed during the development of the developing step (for example, see WO2005-069076 and WO2006-035790) may be used. In terms of the throughput, the developer-removable protective film is preferably used.

When the next step, the exposure step, is performed with radiation having a wavelength of 50 nm or less, it is preferable to use a resin having the structural unit (B) and the structural unit (E) as the base resin in the composition.

[Upper Film Forming Step]

In the present step, an upper film is provided on the resist film using a composition for forming an upper film. As the composition for forming an upper film, for example, a conventionally known composition disclosed in JP-A-2005-352384 or the like can be used. The composition for forming an upper film is applied onto the resist film to form the upper film. Examples of the method for applying the composition for forming an upper film include the same method as the method for applying the radiation-sensitive resin composition in the resist film forming step. In the present step, it is preferable to perform prebaking (PB) after applying the composition for forming an upper film. The formation of the upper film on the resist film in such a way prevents direct contact between the resist film and a liquid immersion medium, which effectively prevents reduction in the lithography performance of the resist film caused by penetration of the liquid immersion medium into the resist film and contamination of the lens of a projection exposure apparatus with components eluted from the resist film into the liquid immersion medium.

The thickness of the upper film formed is preferably close to an odd multiple of $\lambda/4$ m (wherein $\lambda$ represents the wavelength of radiation, m represents the refractive index of the upper film) as much as possible. This makes it possible to enhance the effect of preventing reflection on the upper interface of the resist film.

[Exposing Step]

In this step, the resist film formed in the resist film forming step is exposed by irradiating with a radioactive ray through a photomask (optionally through an immersion medium such as water). Examples of the radioactive ray used for the exposure include visible ray, ultraviolet ray, far ultraviolet ray, extreme ultraviolet ray (EUV); an electromagnetic wave including X ray and $\gamma$ ray; an electron beam; and a charged particle radiation such as a ray. Among them, far ultraviolet ray, an electron beam, or EUV is preferred. ArF excimer laser light (wavelength is 193 nm), KrF excimer laser light (wavelength is 248 nm), an electron beam, or EUV is more preferred. ArF excimer laser light or EUV is further preferred.

When the exposure is carried out by immersion exposure, examples of the immersion liquid include water and fluorine-based inert liquid. The immersion liquid is preferably a liquid which is transparent with respect to the exposing wavelength, and has a minimum temperature factor of the refractive index so that the distortion of the light image reflected on the film becomes minimum. However, when the exposing light source is ArF excimer laser light (wavelength is 193 nm), water is preferably used because of the ease of availability and ease of handling in addition to the above considerations. When water is used, a small proportion of an additive that decreases the surface tension of water and increases the surface activity may be added. Preferably, the additive cannot dissolve the resist film on the wafer and can neglect an influence on an optical coating at an under surface of a lens. The water used is preferably distilled water.

After the exposure, post exposure bake (PEB) is preferably carried out to promote the dissociation of the acid-dissociable group in the resin by the acid generated from the radiation-sensitive acid generator with the exposure in the exposed part of the resist film. The difference of solubility into the developer between the exposed part and the unexposed part is generated by the PEB. The temperature of PEB is typically from 50° C. to 180° C., and preferably from 80° C. to 130° C. The duration of PEB is typically from 5 seconds to 600 seconds, and preferably from 10 seconds to 300 seconds.

[Developing Step]

In this step, the resist film exposed in the exposing step is developed. By this step, the predetermined resist pattern can be formed. After the development, the resist pattern is washed with a rinse solution such as water or alcohol, and the dried, in general. The upper film can be easily removed by a developer during development, or by a cleaning solution during cleaning when cleaning is performed after development.

Examples of the developer used for the development include, in the alkaline development, an alkaline aqueous solution obtained by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, 1,5-diazabicyclo-[4.3.0]-5-nonene. Among them, an aqueous TMAH solution is preferred, and 2.38% by mass of aqueous TMAH solution is more preferred.

In the case of the development with organic solvent, examples of the solvent include an organic solvent, including a hydrocarbon-based solvent, an ether-based solvent, an ester-based solvent, a ketone-based solvent, and an alcohol-based solvent; and a solvent containing an organic solvent. Examples of the organic solvent include one, two or more solvents listed as the solvent for the radiation-sensitive resin composition. Among them, an ester-based solvent or a ketone-based solvent is preferred. The ester-based solvent is preferably an acetate ester-based solvent, and more preferably n-butyl acetate or amyl acetate. The ketone-based solvent is preferably a chain ketone, and more preferably 2-heptanone. The content of the organic solvent in the developer is preferably not less than 80% by mass, more preferably not less than 90% by mass, further preferably not less than 95% by mass, and particularly preferably not less than 99% by mass. Examples of the ingredient other than the organic solvent in the developer include water and silicone oil.

Examples of the developing method include a method of dipping the substrate in a tank filled with the developer for a given time (dip method); a method of developing by putting and leaving the developer on the surface of the substrate with the surface tension for a given time (paddle method); a method of spraying the developer on the surface of the substrate (spray method); and a method of injecting the developer while scanning an injection nozzle for the developer at a constant rate on the substrate rolling at a constant rate (dynamic dispense method).

EXAMPLES

Hereinafter, the present invention will be specifically described with reference to Examples, but the present invention is not limited to these Examples. Methods for measuring various physical property values will be described below.

[Weight-Average Molecular Weight (Mw) and Number-Average Molecular Weight (Mn)]]

The Mw and Mn of the resin were measured under the above conditions. Dispersity (Mw/Mn) was calculated from results of the measured Mw and Mn.

[$^{13}$C-Nmr Analysis]

$^{13}$C-NMR analysis of the resin was performed using a nuclear magnetic resonance apparatus ("JNM-Delta 400" manufactured by JEOL Ltd.).

[Fluorine Content]

The fluorine content in the resin was calculated by calculating the theoretical fluorine element analysis value of a monomer containing fluorine, and using the abundance ratio of the monomer in the whole resin.

<Synthesis of Monomer Compound>

[Synthesis Example 1](Synthesis of Compound (M-1))

20.0 mmol of ethyl 2-(bromomethyl)acrylate, 30.0 mmol of isopropyl alcohol, 40.0 mmol of diisopropylethylamine, and 50 g of dimethyl sulfoxide were added into a reaction vessel, followed by stirring at 60° C. for 12 hours. Thereafter, the reaction solution was cooled to 30° C. or lower, diluted by adding water, and then extracted by adding ethyl acetate, to separate an organic layer. The resulting organic layer was washed with a saturated aqueous solution of sodium chloride and then with water. The washed product was dried over sodium sulfate, and a solvent was then distilled off. Purification by column chromatography gave an ether derivative in good yield.

By adding a mixed solution of methanol and water (1:1 (mass ratio)) to the ether derivative to form a 1 M solution, and then adding 20.0 mmol of sodium hydroxide thereto, the mixture was reacted at room temperature for 1 hour. Thereafter, the reaction solution was cooled to 30° C. or lower, and 1 M hydrochloric acid was added thereto to make the inside of the system acidic. The reaction solution was extracted by adding dichloromethane, to separate an organic layer. The resulting organic layer was washed with a saturated aqueous solution of sodium chloride and then with water. After drying with sodium sulfate, a solvent was distilled off to obtain a carboxylic acid form in good yield.

30.0 mmol of 1-(3-dimethylaminopropyl)-3-ethylcarbodiimide hydrochloride, 3.0 mmol of 4-dimethylaminopyridine, 30.0 mmol of α-hydroxy-γ-butyrolactone, and 50 g of dichloromethane were added to the carboxylic acid form, and the mixture was stirred at room temperature for 2 hours. Thereafter, the reaction solution was cooled to 30° C. or lower, diluted by adding water, and then extracted by adding dichloromethane, to separate an organic layer. The resulting organic layer was washed with a saturated aqueous solution of sodium chloride and then with water. The washed product was dried over sodium sulfate, and a solvent was then distilled off. The residue was purified by column chromatography to obtain a compound represented by the following formula (M-1) (hereinafter, may be described as "compound (M-1)" or "monomer (M-1)") in a good yield. The synthesis scheme of the compound (M-1) is shown below.

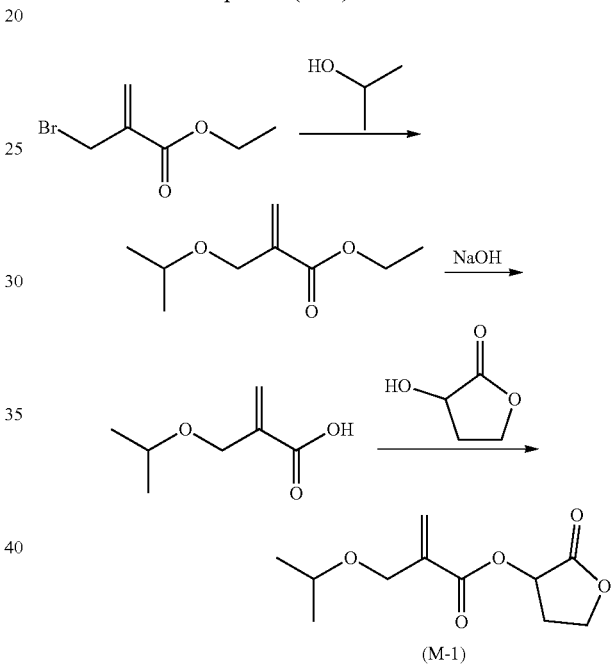

(M-1)

[Synthesis Examples 2 to 18](Synthesis of Monomer (M-2) to Monomer (M-18))

Compounds represented by the following formulas (M-2) to (M-18) were synthesized in the same manner as in Synthesis Example 1 except that the raw materials and the precursor were appropriately changed. Hereinafter, the compounds represented by formulas (M-2) to (M-18) may be respectively referred to as "compound (M-2)" to "compound (M-18)" or "monomer (M-2)" to "monomer (M-18)".

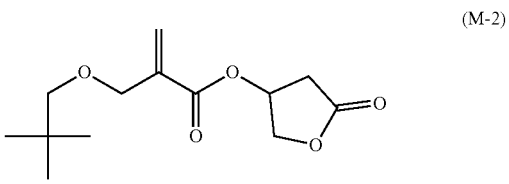

(M-2)

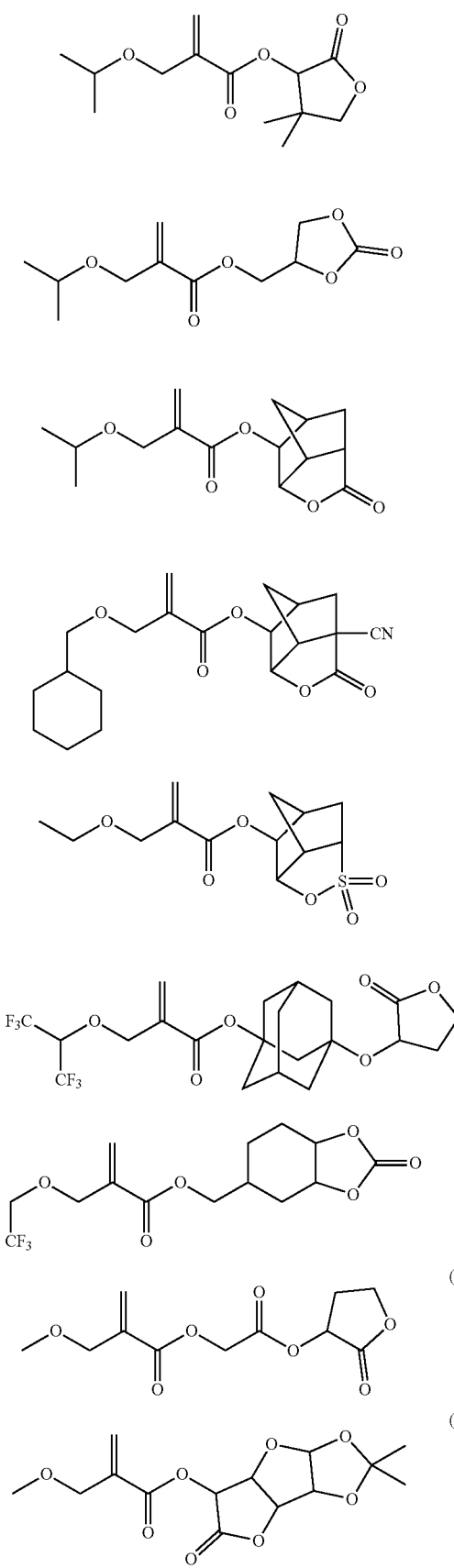
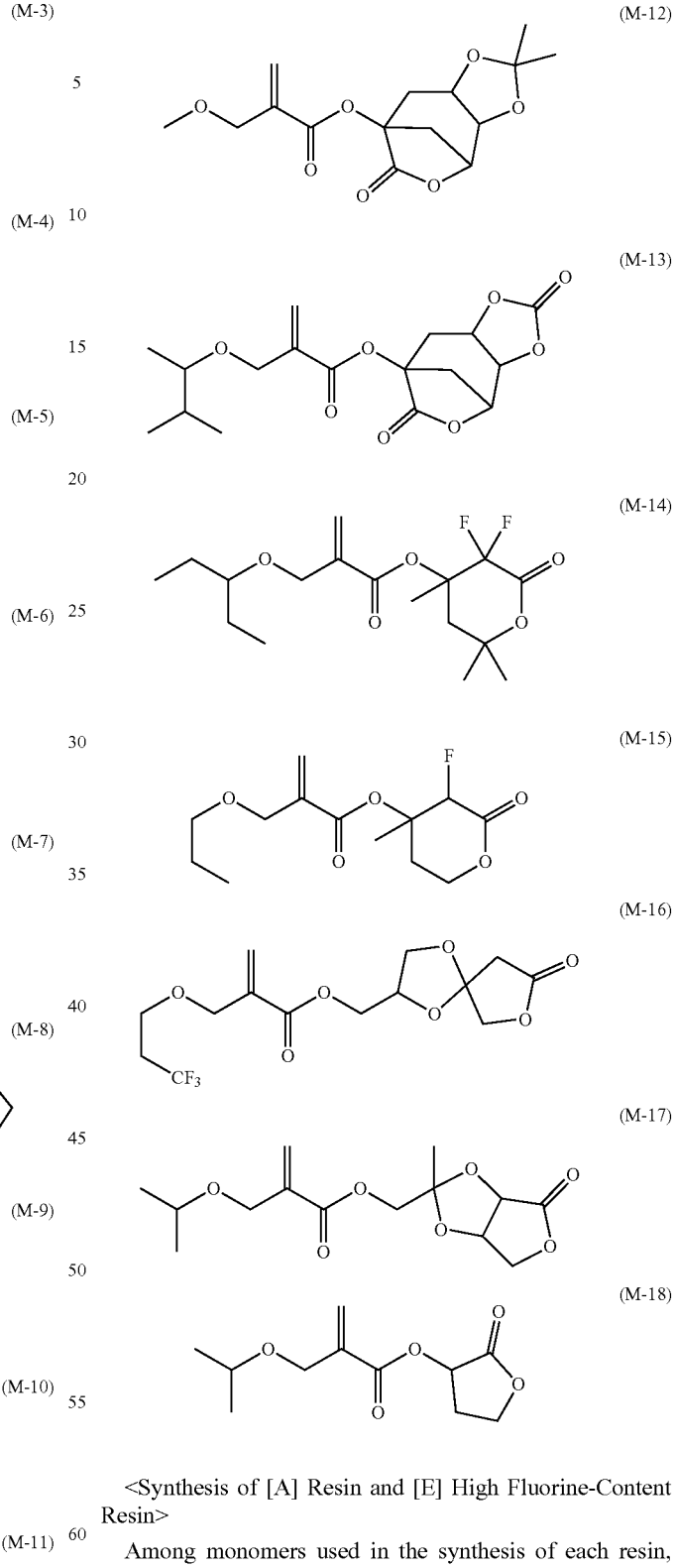

<Synthesis of [A] Resin and [E] High Fluorine-Content Resin>

Among monomers used in the synthesis of each resin, monomers other than the monomers (M-1) to (M-18) are shown below. In the following synthesis examples, unless otherwise specified, parts by mass means a value when the total mass of monomers used is 100 parts by mass, and mol % means a value when the total number of moles of monomers used is 100 mol %.

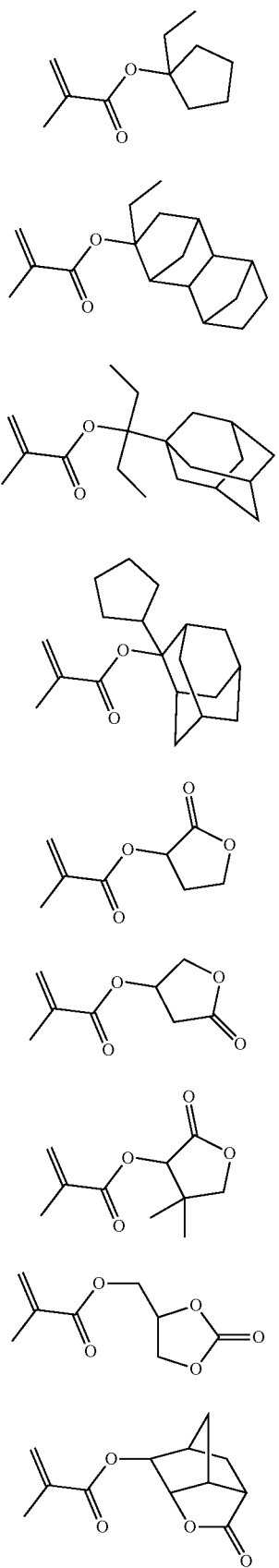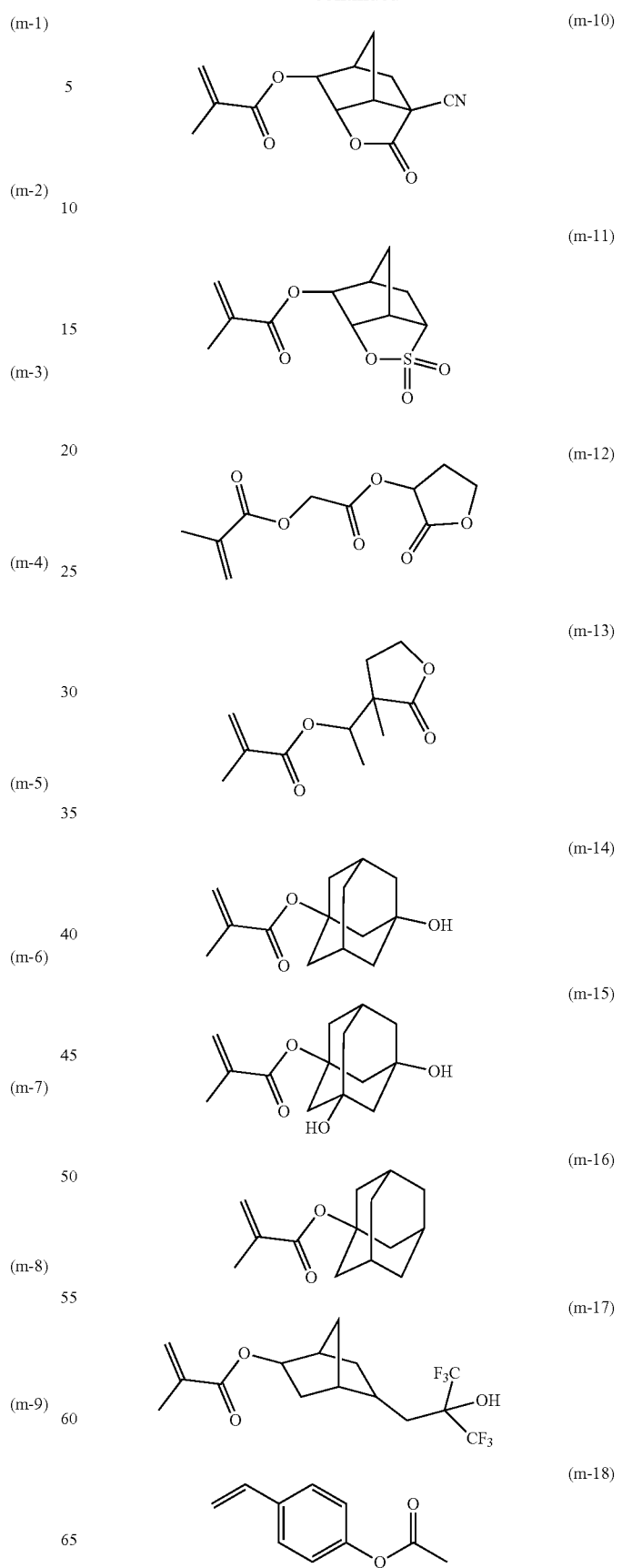

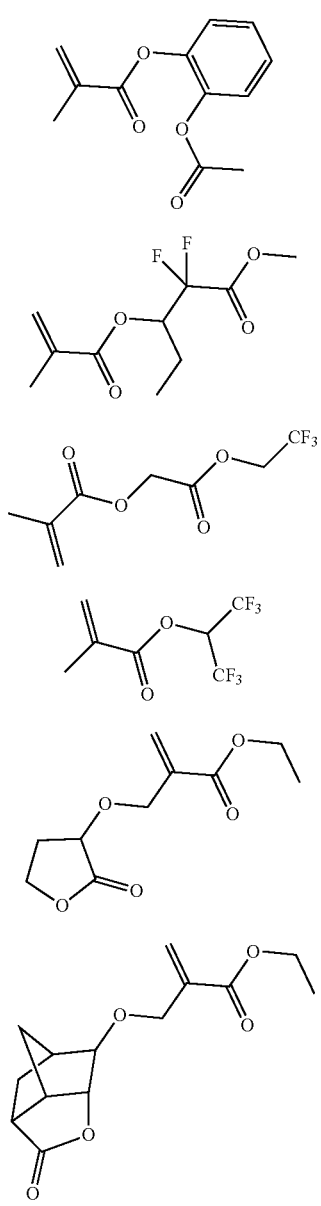

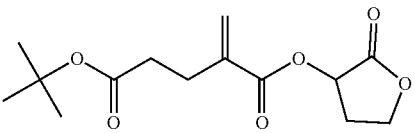

Synthesis Example 19

(Synthesis of Resin (A-1))

The monomer (M-1) and the monomer (m-1) were dissolved in 2-butanone (200 parts by mass) so as to have a molar ratio of 50/50 (mol %), and AIBN (azobisisobutyronitrile) (5 mol % with respect to 100 mol % in total of the used monomers) was added as an initiator to prepare a monomer solution. An empty reaction vessel was charged with 2-butanone (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The cooled polymerization solution was added to methanol (2,000 parts by mass), and the precipitated white powder was separated by filtration. The separated white powder was washed with methanol twice, then separated by filtration, and dried at 50° C. for 10 hours to obtain a white powdery resin (A-1) (yield: 80%). The resin (A-1) had a Mw of 6,100 and a Mw/Mn of 1.61. As a result of $^{13}$C-NMR analysis, the contents of the structural units derived from the monomer (M-1) and the monomer (m-1) were 49.0 mol %, and 51.0 mol %, respectively. The fluorine content was 0.0%.

[Synthesis Examples 20 to 50] (Synthesis of Resin (A-2) to Resin (A-32))

Resins (A-2) to (A-32) were synthesized in the same manner as in Synthesis Example 19 except that monomers having types and blending ratios shown in the following Tables 1 and 2 were used. The content by percent (mol %) of the structural unit and physical property value (Mw, Mw/Mn, and fluorine content) of each of the obtained resins are also shown in the following Tables 1 and 2. In the following Tables 1 and 2, "-" indicates that the corresponding monomer is not used.

TABLE 1

| | Resin [A] | Monomer that gives structural unit (A) | | | Monomer that gives structural unit (B) | | | Monomer that gives structural unit (C) | | |
|---|---|---|---|---|---|---|---|---|---|---|
| | | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) |
| Synthesis Example 19 | A-1 | M-1 | 50 | 49.0 | m-1 | 50 | 51.0 | — | — | — |
| Synthesis Example 20 | A-2 | M-2 | 50 | 48.3 | m-1 m-3 | 40 10 | 40.7 11.0 | — | — | — |
| Synthesis Example 21 | A-3 | M-1 | 25 | 24.6 | m-1 m-3 | 40 10 | 41.1 9.2 | m-6 | 25 | 25.1 |
| Synthesis Example 22 | A-4 | M-2 | 40 | 39.3 | m-1 m-3 | 40 10 | 40.7 11.1 | — | — | — |
| Synthesis Example 23 | A-5 | M-3 | 50 | 49.4 | m-1 m-2 | 40 10 | 40.0 10.6 | — | — | — |

TABLE 1-continued

| | | | | | | | | | | |
|---|---|---|---|---|---|---|---|---|---|---|
| Synthesis Example 24 | A-6 | M-4 | 50 | 49.1 | m-1 | 40 | 41.3 | — | — | — |
| | | | | | m-4 | 10 | 9.6 | | | |
| Synthesis Example 25 | A-7 | M-5 | 25 | 23.8 | m-1 | 40 | 42.2 | m-6 | 25 | 23.8 |
| | | | | | m-3 | 10 | 10.2 | | | |
| Synthesis Example 26 | A-8 | M-6 | 40 | 39.7 | m-1 | 30 | 31.5 | m-9 | 25 | 24.0 |
| | | | | | m-2 | 5 | 4.8 | | | |
| Synthesis Example 27 | A-9 | M-7 | 20 | 18.4 | m-1 | 50 | 51.5 | m-8 | 20 | 19.3 |
| | | | | | m-4 | 10 | 10.8 | | | |
| Synthesis Example 28 | A-10 | M-8 | 20 | 19.3 | m-1 | 60 | 59.7 | m-10 | 20 | 21.0 |
| Synthesis Example 29 | A-11 | M-9 | 30 | 29.5 | m-1 | 50 | 50.3 | m-8 | 10 | 10.5 |
| Synthesis Example 30 | A-12 | M-10 | 20 | 18.8 | m-1 | 50 | 50.0 | m-6 | 20 | 20.5 |
| | | | | | m-4 | 10 | 10.7 | | | |
| Synthesis Example 31 | A-13 | M-11 | 40 | 38.9 | m-1 | 40 | 41.4 | m-10 | 10 | 9.9 |
| | | | | | m-3 | 10 | 9.8 | | | |
| Synthesis Example 32 | A-14 | M-12 | 30 | 29.0 | m-1 | 40 | 40.7 | m-5 | 20 | 20.8 |
| | | | | | m-4 | 10 | 9.5 | | | |
| Synthesis Example 33 | A-15 | M-13 | 20 | 18.7 | m-1 | 40 | 40.5 | m-8 | 20 | 19.5 |
| | | | | | m-4 | 10 | 8.9 | | | |
| Synthesis Example 34 | A-16 | M-14 | 30 | 29.3 | m-1 | 30 | 32.1 | m-11 | 30 | 30.3 |
| | | | | | m-2 | 10 | 8.3 | | | |
| Synthesis Example 35 | A-17 | M-15 | 30 | 28.5 | m-1 | 60 | 61.0 | m-7 | 10 | 10.5 |
| Synthesis Example 36 | A-18 | M-16 | 40 | 39.0 | m-1 | 30 | 31.1 | m-13 | 10 | 10.4 |
| | | | | | m-3 | 10 | 8.7 | | | |
| Synthesis Example 37 | A-19 | M-17 | 30 | 28.8 | m-1 | 50 | 50.8 | m-5 | 20 | 20.4 |
| Synthesis Example 38 | A-20 | M-18 | 50 | 48.1 | m-1 | 50 | 51.9 | — | — | — |

| | Monomer that gives structural unit (D) | | | | | |
|---|---|---|---|---|---|---|
| | Type | Blending ratio (mol %) | Content by percent of structural unit (mol %) | Mw | Mw/Mn | Fluorine content (%) |
| Synthesis Example 19 | — | — | — | 6100 | 1.61 | 0.0 |
| Synthesis Example 20 | — | — | — | 6500 | 1.57 | 0.0 |
| Synthesis Example 21 | — | — | — | 5800 | 1.63 | 0.0 |
| Synthesis Example 22 | m-14 | 10 | 8.9 | 7000 | 1.7 | 0.0 |
| Synthesis Example 23 | — | — | — | 6200 | 1.56 | 0.0 |
| Synthesis Example 24 | — | — | — | 6900 | 1.71 | 0.0 |
| Synthesis Example 25 | — | — | — | 7100 | 1.66 | 0.0 |
| Synthesis Example 26 | — | — | — | 6500 | 1.65 | 0.0 |
| Synthesis Example 27 | — | — | — | 6600 | 1.61 | 0.0 |
| Synthesis Example 28 | — | — | — | 6100 | 1.57 | 4.7 |
| Synthesis Example 29 | m-14 | 10 | 9.7 | 7100 | 1.60 | 5.1 |
| Synthesis Example 30 | — | — | — | 5900 | 1.65 | 0.0 |
| Synthesis Example 31 | — | — | — | 6000 | 1.61 | 0.0 |
| Synthesis Example 32 | — | — | — | 6400 | 1.57 | 0.0 |
| Synthesis Example 33 | m-15 | 10 | 12.4 | 7100 | 1.63 | 0.0 |
| Synthesis Example 34 | — | — | — | 6200 | 1.65 | 3.3 |
| Synthesis Example 35 | — | — | — | 6500 | 1.61 | 0.0 |
| Synthesis Example 36 | m-14 | 10 | 10.8 | 5900 | 1.57 | 6.4 |

TABLE 1-continued

|  | | | | Mw | Mw/Mn | Fluorine content (%) |
|---|---|---|---|---|---|---|
| Synthesis Example 37 | — | — | — | 6100 | 1.63 | 0.0 |
| Synthesis Example 38 | — | — | — | 6200 | 1.65 | 0.0 |

|  | Resin [A] | Monomer that gives structural unit (B) | | Monomer that gives structural unit (C) | | Monomer that gives structural unit (D) | | Mw | Mw/Mn | Fluorine content (%) |
|---|---|---|---|---|---|---|---|---|---|---|
|  |  | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) | | | |
| Synthesis Example 39 | A-21 | m-1 | 50 | 49.3 | m-5 | 50 | 50.7 | — | — | — | 6900 | 1.65 | 0.0 |
| Synthesis Example 40 | A-22 | m-1 m-3 | 40 10 | 40.2 8.9 | m-6 | 50 | 50.9 | — | — | — | 6400 | 1.61 | 0.0 |
| Synthesis Example 41 | A-23 | m-1 m-3 | 40 10 | 39.5 9.6 | m-6 | 40 | 41.2 | m-14 | 10 | 9.7 | 7000 | 1.63 | 0.0 |
| Synthesis Example 42 | A-24 | m-1 m-2 | 40 10 | 40.2 9.2 | m-7 | 50 | 50.6 | — | — | — | 6500 | 1.57 | 0.0 |
| Synthesis Example 43 | A-25 | m-1 m-4 | 40 10 | 40.6 8.6 | m-8 | 50 | 50.8 | — | — | — | 6100 | 1.66 | 0.0 |
| Synthesis Example 44 | A-26 | m-1 m-3 | 40 10 | 39.0 9.1 | m-6 m-11 | 25 25 | 26.1 25.8 | — | — | — | 6100 | 1.56 | 0.0 |
| Synthesis Example 45 | A-27 | m-1 m-2 | 30 5 | 30.2 4.4 | m-9 m-10 | 25 40 | 26.0 39.4 | — | — | — | 6000 | 1.70 | 0.0 |
| Synthesis Example 46 | A-28 | m-1 m-4 | 50 10 | 49.7 10.3 | m-6 m-12 | 20 20 | 21.7 18.3 | — | — | — | 6500 | 1.62 | 0.0 |
| Synthesis Example 47 | A-29 | m-1 m-4 | 40 10 | 39.5 9.0 | m-13 | 40 | 41.8 | m-15 | 10 | 9.7 | 6200 | 1.59 | 0.0 |
| Synthesis Example 48 | A-30 | m-1 | 50 | 52.4 | m-23 | 50 | 47.6 | — | — | — | 6800 | 1.60 | 0.0 |
| Synthesis Example 49 | A-31 | m-1 m-3 | 40 10 | 41.2 9.3 | m-6 m-24 | 25 25 | 27.1 22.4 | — | — | — | 6300 | 1.55 | 0.0 |
| Synthesis Example 50 | A-32 | m-1 | 50 | 55.5 | m-25 | 50 | 44.5 | — | — | — | 4900 | 1.77 | 0.0 |

Synthesis Example 51

(Synthesis of Resin (A-33))

The monomer (M-3), the monomer (m-1) and the monomer (M-18) were dissolved in 1-methoxy-2-propanol (200 parts by mass) so as to have a molar ratio of 20/40/40 (mol %), and AIBN (5 mol %) was added as an initiator to prepare a monomer solution. A reaction vessel was charged with 1-methoxy-2-propanol (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The cooled polymerization solution was added to hexane (2,000 parts by mass), and the precipitated white powder was separated by filtration. The separated white powder was washed twice with hexane, then separated by filtration, and dissolved in 1-methoxy-2-propanol (300 parts by mass). Subsequently, methanol (500 parts by mass), triethylamine (50 parts by mass), and ultra-pure water (10 parts by mass) were added, and a hydrolysis reaction was performed at 70° C. for 6 hours with stirring. After completion of the reaction, the remaining solvent was distilled off. The obtained solid was dissolved in acetone (100 parts by mass). The solution was added dropwise to water (500 parts by mass) to solidify the resin. The resulting solid was separated by filtration and dried at 50° C. for 13 hours to obtain a white powdery resin (A-33) (yield: 73%). The resin (A-33) had a Mw of 6,100 and a Mw/Mn of 1.60. As a result of $^{13}$C-NMR analysis, the contents of the structural units derived from (M-3), (m-1) and (M-18) were 19.4 mol %, 40.7 mol % and 39.9 mol %, respectively. The fluorine content was 0.0%.

Synthesis Examples 52 to 57

(Synthesis of Resins (A-34) to (A-39))

Resins (A-34) to (A-39) were synthesized in the same manner as in Synthesis Example 51 except that monomers of types and blending ratios shown in the following Tables 3 and 4 were used. The content (mol %) of each structural unit and physical property values (Mw, Mw/Mn and fluorine content) for the obtained resins are also shown in the following Tables 3 and 4.

TABLE 3

| | Resin [A] | Monomer that gives structural unit (A) | | | Monomer that gives structural unit (B) | | | Monomer that gives structural unit (D) | | |
|---|---|---|---|---|---|---|---|---|---|---|
| | | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) |
| Synthesis Example 51 | A-33 | M-3 | 20 | 19.4 | m-1 | 40 | 40.7 | — | — | — |
| Synthesis Example 52 | A-34 | M-7 | 20 | 18.9 | m-1 | 40 | 39.9 | — | — | — |
| Synthesis Example 53 | A-35 | M-7 | 20 | 18.4 | m-1 | 40 | 50.5 | m-17 | 10 | 10.8 |
| Synthesis Example 54 | A-36 | M-15 | 20 | 19.00 | m-1 | 40 | 40.4 | — | — | — |

| | Monomer that gives structural unit (E) | | | | | |
|---|---|---|---|---|---|---|
| | Type | Blending ratio (mol %) | Content by percent of structural unit (mol %) | Mw | Mw/Mn | Fluorine content (%) |
| Synthesis Example 51 | m-18 | 40 | 39.9 | 6100 | 1.60 | 0.0 |
| Synthesis Example 52 | m-18 | 40 | 41.2 | 6300 | 1.61 | 0.0 |
| Synthesis Example 53 | m-18 | 20 | 20.3 | 6000 | 1.72 | 3.2 |
| Synthesis Example 54 | m-1m | 40 | 40.6 | 6500 | 1.65 | 0.0 |

TABLE 4

| | Resin [A] | Monomer that gives structural unit (B) | | | Monomer that gives structural unit (C) | | | Monomer that gives structural unit (D) | | |
|---|---|---|---|---|---|---|---|---|---|---|
| | | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) |
| Synthesis Example 55 | A-37 | M-1 | 40 | 41.2 | m-7 | 20 | 21.4 | — | — | — |
| Synthesis Example 56 | A-38 | M-1 | 40 | 40.8 | m-11 | 20 | 20.7 | — | — | — |
| Synthesis Example 57 | A-39 | M-1 | 50 | 50.2 | m-11 | 20 | 20.9 | m-17 | 10 | 10.6 |

| | Monomer that gives structural unit (E) | | | | | |
|---|---|---|---|---|---|---|
| | Type | Blending ratio (mol %) | Content by percent of structural unit (mol %) | Mw | Mw/Mn | Fluorine content (%) |
| Synthesis Example 55 | m-18 | 40 | 37.4 | 6500 | 1.65 | 0.0 |
| Synthesis Example 56 | m-19 | 40 | 38.5 | 6200 | 1.62 | 0.0 |
| Synthesis Example 57 | m-18 | 20 | 18.3 | 5900 | 1.66 | 3.2 |

Synthesis Example 58

(Synthesis of High Fluorine-Content Resin (E-1))

The monomer (m-1) and the monomer (m-20) were dissolved in 2-butanone (200 parts by mass) so as to have a molar ratio of 10/90 (mol %), and AIBN (5 mol %) was added as an initiator to prepare a monomer solution. A reaction vessel was charged with 2-butanone (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The operation of replacing the solvent with acetonitrile (400 parts by mass), then adding hexane (100 parts by mass), stirring the mixture, and recovering the acetonitrile layer was repeated three times. The solvent was replaced with propylene glycol monomethyl ether acetate to obtain a solution of a high fluorine-content resin (E-1) (yield: 81%). The high fluorine-content resin (E-1) had a Mw of 6,300 and a Mw/Mn of 1.67. As a result of $^{13}$C-NMR analysis, the contents of the structural units derived from (m-1) and (m-20) were 10.8 mol % and 89.2 mol %, respectively. The fluorine content was 14.5%.

Synthesis Examples 59 to 61

(Synthesis of High Fluorine-Content Resins (E-2) to (E-5))

High fluorine-content resins (E-2) to (E-5) were synthesized in the same manner as in Synthesis Example 16 except that monomers of the types and blending ratios shown in the following Table 5 were used. The content (mol %) of each structural unit and physical property values (Mw, Mw/Mn and fluorine content) for the obtained high fluorine-content resins are shown in the following Table 5.

<Preparation of Radiation-Sensitive Resin Composition>

Components other than the resin [A] and the high fluorine content resin [E] used for preparing each radiation-sensitive resin composition are shown below.

[Radiation-Sensitive Acid Generator [B]]

B-1 to B-6: Compounds represented by the following formulas (B-1) to (B-6)

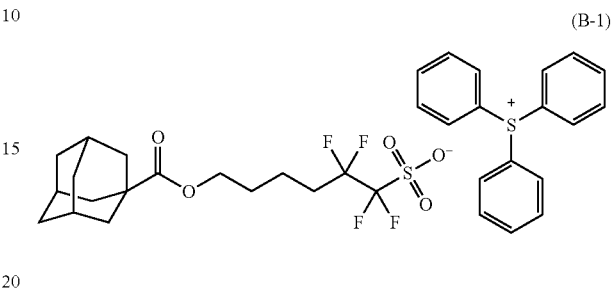

(B-1)

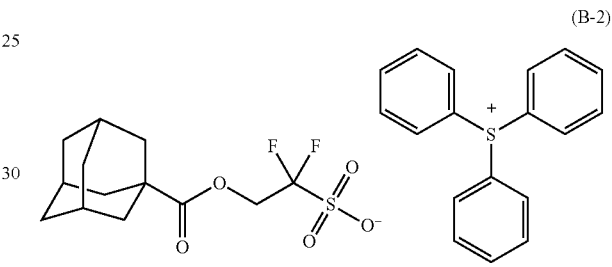

(B-2)

TABLE 5

| | High fluroine content Resin [E] | Monomer that gives structural unit (F) or (G) | | | Monomer that gives structural unit (B) | | | Monomer that gives structural unit (D) | | |
|---|---|---|---|---|---|---|---|---|---|---|
| | | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) |
| Synthesis Example 58 | E-1 | m-20 | 90 | 89.2 | m-1 | 10 | 10.8 | — | — | — |
| Synthesis Example 59 | E-2 | m-21 | 80 | 81.9 | m-1 | 20 | 18.1 | — | — | — |
| Synthesis Example 60 | E-3 | m-22 | 60 | 58.8 | — | — | — | — | — | — |
| Synthesis Example 61 | E-4 | m-22 | 40 | 38.9 | m-1 | 10 | 9.5 | m-17 | 50 | 51.6 |

| | Monomer that gives structural unit | | | | | |
|---|---|---|---|---|---|---|
| | Type | Blending ratio (mol %) | Content by percent of structural unit (mol %) | Mw | Mw/Mn | Fluorine content (%) |
| Synthesis Example 58 | — | — | — | 6300 | 1.67 | 14.5 |
| Synthesis Example 59 | — | — | — | 7200 | 1.77 | 20.2 |
| Synthesis Example 60 | m-16 | 40 | 41.2 | 6500 | 1.81 | 29.0 |
| Synthesis Example 61 | — | — | — | 7000 | 1.76 | 35.1 |

-continued

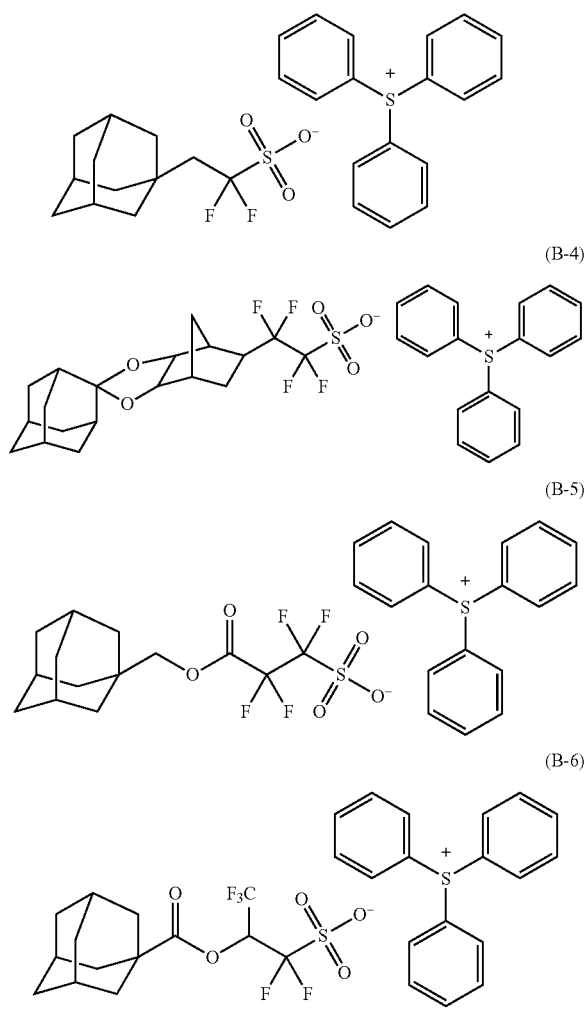

(B-3)
(B-4)
(B-5)
(B-6)

[Acid Diffusion Controlling Agent [C]]

C-1 to C-5: Compounds represented by the following formulas (C-1) to (C-5)

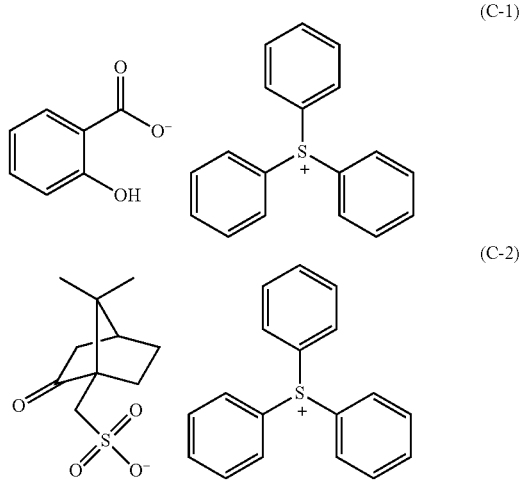

(C-1)
(C-2)

-continued

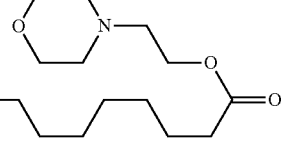

(C-3)

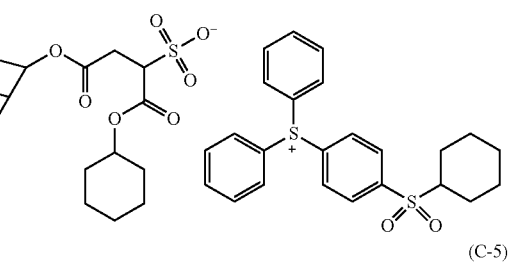

(C-4)

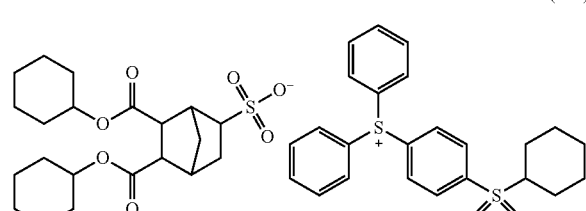

(C-5)

[Solvent [D]]

D-1: propylene glycol monomethyl ether acetate

D-2: cyclohexanone

D-3: γ-butyrolactone

D-4: ethyl lactate

Preparation of Positive Radiation-Sensitive Resin Composition for ArF Exposure

Example 1

100 parts by mass of (A-1) as the resin [A], 14.0 parts by mass of (B-4) as the radiation-sensitive acid generator [B], 8.0 parts by mass of (C-2) as the acid diffusion controlling agent [C], 5.0 parts by mass (solid content) of (E-1) as the high fluorine content resin [E], and 3,230 parts by mass of a mixed solvent of (D-1)/(D-2)/(D-3) as the solvent [D] were mixed, and the mixture was filtered through a membrane filter having a pore size of 0.2 μm to prepare a radiation-sensitive resin composition (J-1).

Examples 2 to 38 and Comparative Examples 1 to 12

Radiation-sensitive resin compositions (J-2) to (J-38) and (CJ-1) to (CJ-12) were prepared in the same manner as in Example 1 except that the components of the types and contents shown in the following Table 6 were used.

TABLE 6

| Radiation-sensitive resin composition | | Resin [A] | | Radiation-sensitive acid generator [B] | | Acid diffusion controlling agent [C] | | High fluorine content resin [E] | | Solvent [D] | |
|---|---|---|---|---|---|---|---|---|---|---|---|
| | Type | Type | Content (parts by mass) | Type | Content (parts by mass) | Type | Content (parts by mass) | Type | Content (parts by mass) | Type | Content (parts by mass) |
| Example 1 | J-1 | A-1 | 100 | B-4 | 14.0 | C-2 | 8.0 | E-1 | 5.0 | D-1/D-2/D-3 | 2240/960/30 |
| Example 2 | J-2 | A-2 | 100 | B-4 | 14.0 | C-2 | 8.0 | E-1 | 5.0 | D-1/D-2/D-3 | 2240/960/30 |
| Example 3 | J-3 | A-3 | 100 | B-4 | 14.0 | C-2 | 8.0 | E-1 | 5.0 | D-1/D-2/D-3 | 2240/960/30 |
| Example 4 | J-4 | A-4 | 100 | B-4 | 14.0 | C-2 | 8.0 | E-1 | 5.0 | D-1/D-2/D-3 | 2240/960/30 |
| Example 5 | J-5 | A-5 | 100 | B-4 | 14.0 | C-2 | 8.0 | E-1 | 5.0 | D-1/D-2/D-3 | 2240/960/30 |
| Example 6 | J-6 | A-6 | 100 | B-4 | 14.0 | C-2 | 8.0 | E-1 | 5.0 | D-1/D-2/D-3 | 2240/960/30 |
| Example 7 | J-7 | A-7 | 100 | B-4 | 14.0 | C-2 | 8.0 | E-1 | 5.0 | D-1/D-2/D-3 | 2240/960/30 |
| Example 8 | J-8 | A-8 | 100 | B-4 | 14.0 | C-2 | 8.0 | E-1 | 5.0 | D-1/D-2/D-3 | 2240/960/30 |
| Example 9 | J-9 | A-9 | 100 | B-4 | 14.0 | C-2 | 8.0 | E-1 | 5.0 | D-1/D-2/D-3 | 2240/960/30 |
| Example 10 | J-10 | A-10 | 100 | B-4 | 14.0 | C-2 | 8.0 | E-1 | 5.0 | D-1/D-2/D-3 | 2240/960/30 |
| Example 11 | J-11 | A-11 | 100 | B-4 | 14.0 | C-2 | 8.0 | E-1 | 5.0 | D-1/D-2/D-3 | 2240/960/30 |
| Example 12 | J-12 | A-12 | 100 | B-4 | 14.0 | C-2 | 8.0 | E-1 | 5.0 | D-1/D-2/D-3 | 2240/960/30 |
| Example 13 | J-13 | A-13 | 100 | B-4 | 14.0 | C-2 | 8.0 | E-1 | 5.0 | D-1/D-2/D-3 | 2240/960/30 |
| Example 14 | J-14 | A-14 | 100 | B-4 | 14.0 | C-2 | 8.0 | E-1 | 5.0 | D-1/D-2/D-3 | 2240/960/30 |
| Example 15 | J-15 | A-15 | 100 | B-4 | 14.0 | C-2 | 8.0 | E-1 | 5.0 | D-1/D-2/D-3 | 2240/960/30 |
| Example 16 | J-16 | A-16 | 100 | B-4 | 14.0 | C-2 | 8.0 | E-1 | 5.0 | D-1/D-2/D-3 | 2240/960/30 |
| Example 17 | J-17 | A-17 | 100 | B-4 | 14.0 | C-2 | 8.0 | E-1 | 5.0 | D-1/D-2/D-3 | 2240/960/30 |
| Example 18 | J-18 | A-18 | 100 | B-4 | 14.0 | C-2 | 8.0 | E-1 | 5.0 | D-1/D-2/D-3 | 2240/960/30 |
| Example 19 | J-19 | A-19 | 100 | B-4 | 14.0 | C-2 | 8.0 | E-1 | 5.0 | D-1/D-2/D-3 | 2240/960/30 |
| Example 20 | J-20 | A-20 | 100 | B-4 | 14.0 | C-2 | 8.0 | E-1 | 5.0 | D-1/D-2/D-3 | 2240/960/30 |
| Example 21 | J-21 | A-1 | 100 | B-1 | 14.0 | C-2 | 8.0 | E-1 | 5.0 | D-1/D-2/D-3 | 2240/960/30 |
| Example 22 | J-22 | A-1 | 100 | B-2 | 14.0 | C-2 | 8.0 | E-1 | 5.0 | D-1/D-2/D-3 | 2240/960/30 |
| Example 23 | J-23 | A-1 | 100 | B-3 | 14.0 | C-2 | 8.0 | E-1 | 5.0 | D-1/D-2/D-3 | 2240/960/30 |
| Example 24 | J-24 | A-1 | 100 | B-5 | 14.0 | C-2 | 8.0 | E-1 | 5.0 | D-1/D-2/D-3 | 2240/960/30 |
| Example 25 | J-25 | A-1 | 100 | B-6 | 14.0 | C-2 | 8.0 | E-1 | 5.0 | D-1/D-2/D-3 | 2240/960/30 |
| Example 26 | J-26 | A-1 | 100 | B-4 | 14.0 | C-1 | 8.0 | E-1 | 5.0 | D-1/D-2/D-3 | 2240/960/30 |
| Example 27 | J-27 | A-1 | 100 | B-4 | 14.0 | C-3 | 8.0 | E-1 | 5.0 | D-1/D-2/D-3 | 2240/960/30 |
| Example 28 | J-28 | A-1 | 100 | B-4 | 14.0 | C-4 | 8.0 | E-1 | 5.0 | D-1/D-2/D-3 | 2240/960/30 |
| Example 29 | J-29 | A-1 | 100 | B-4 | 14.0 | C-5 | 8.0 | E-1 | 5.0 | D-1/D-2/D-3 | 2240/960/30 |
| Example 30 | J-30 | A-1 | 100 | B-4 | 14.0 | C-2 | 8.0 | E-2 | 5.0 | D-1/D-2/D-3 | 2240/960/30 |
| Example 31 | J-31 | A-1 | 100 | B-4 | 14.0 | C-2 | 8.0 | E-3 | 5.0 | D-1/D-2/D-3 | 2240/960/30 |
| Example 32 | J-32 | A-1 | 100 | B-4 | 14.0 | C-2 | 8.0 | E-4 | 5.0 | D-1/D-2/D-3 | 2240/960/30 |
| Example 33 | J-33 | A-1 | 100 | B-4/B-3 | 7.0/7.0 | C-2 | 8.0 | E-1 | 5.0 | D-1/D-2/D-3 | 2240/960/30 |
| Example 34 | J-34 | A-1 | 100 | B-4/B-6 | 7.0/7.0 | C-2 | 8.0 | E-1 | 5.0 | D-1/D-2/D-3 | 2240/960/30 |
| Example 35 | J-35 | A-1 | 100 | B-3/B-6 | 7.0/7.0 | C-2 | 8.0 | E-1 | 5.0 | D-1/D-2/D-3 | 2240/960/30 |
| Example 36 | J-36 | A-1 | 100 | B-4 | 14.0 | C-2/C-4 | 4.0/4.0 | E-1 | 5.0 | D-1/D-2/D-3 | 2240/960/30 |
| Example 37 | J-37 | A-1 | 100 | B-4 | 14.0 | C-2/C-5 | 4.0/4.0 | E-1 | 5.0 | D-1/D-2/D-3 | 2240/960/30 |
| Example 38 | J-38 | A-1 | 100 | B-4 | 14.0 | C-4/C-5 | 4.0/4.0 | E-1 | 5.0 | D-1/D-2/D-3 | 2240/960/30 |
| Comparative Example 1 | CJ-1 | A-21 | 100 | B-4 | 14.0 | C-2 | 8.0 | E-1 | 5.0 | D-1/D-2/D-3 | 2240/960/30 |
| Comparative Example 2 | CJ-2 | A-22 | 100 | B-4 | 14.0 | C-2 | 8.0 | E-1 | 5.0 | D-1/D-2/D-3 | 2240/960/30 |
| Comparative Example 3 | CJ-3 | A-23 | 100 | B-4 | 14.0 | C-2 | 8.0 | E-1 | 5.0 | D-1/D-2/D-3 | 2240/960/30 |
| Comparative Example 4 | CJ-4 | A-24 | 100 | B-4 | 14.0 | C-2 | 8.0 | E-1 | 5.0 | D-1/D-2/D-3 | 2240/960/30 |
| Comparative Example 5 | CJ-5 | A-25 | 100 | B-4 | 14.0 | C-2 | 8.0 | E-1 | 5.0 | D-1/D-2/D-3 | 2240/960/30 |
| Comparative Example 6 | CJ-6 | A-26 | 100 | B-4 | 14.0 | C-2 | 8.0 | E-1 | 5.0 | D-1/D-2/D-3 | 2240/960/30 |
| Comparative Example 7 | CJ-7 | A-27 | 100 | B-4 | 14.0 | C-2 | 8.0 | E-1 | 5.0 | D-1/D-2/D-3 | 2240/960/30 |
| Comparative Example 8 | CJ-8 | A-28 | 100 | B-4 | 14.0 | C-2 | 8.0 | E-1 | 5.0 | D-1/D-2/D-3 | 2240/960/30 |
| Comparative Example 9 | CJ-9 | A-29 | 100 | B-4 | 14.0 | C-2 | 8.0 | E-1 | 5.0 | D-1/D-2/D-3 | 2240/960/30 |
| Comparative Example 10 | CJ-10 | A-30 | 100 | B-4 | 14.0 | C-2 | 8.0 | E-1 | 5.0 | D-1/D-2/D-3 | 2240/960/30 |
| Comparative Example 11 | CJ-11 | A-31 | 100 | B-4 | 14.0 | C-2 | 8.0 | E-1 | 5.0 | D-1/D-2/D-3 | 2240/960/30 |
| Comparative Example 12 | CJ-12 | A-32 | 100 | B-4 | 14.0 | C-2 | 8.0 | E-1 | 5.0 | D-1/D-2/D-3 | 2240/960/30 |

<Formation of Resist Pattern Using Positive Radiation-Sensitive Resin Composition for ArF Exposure>

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The positive radiation-sensitive resin composition for ArF exposure prepared above was applied onto the underlayer antireflective film using the spin coater, and subjected to PB (prebake) at 90° C. for 60 seconds. Thereafter, cooling was performed at 23° C. for 30 seconds to form a resist film having an average thickness of 90 nm.

Subsequently, this resist film was exposed through a mask pattern of 40 nm space and 105 nm pitch using an ArF excimer laser immersion exposure apparatus ("TWINSCAN XT-1900i" manufactured by ASML Holding N.V.) under optical conditions of a numeral aperture (NA) of 1.35 and annular illumination (σ=0.8/0.6). After the exposure, PEB (post exposure bake) was performed at 90° C. for 60 seconds. Thereafter, the resist film was subjected to alkaline development using a 2.38 mass % aqueous TMAH solution as an alkaline developer. After the development, the resist film was washed with water and further dried to form a positive resist pattern (40 nm line-and-space pattern). In addition, a positive resist pattern (40 nm hole, 105 nm pitch) was formed in the same manner as in the above operation except that the mask pattern was changed.

<Evaluation>

The sensitivity, LWR performance, and pattern rectangularity of each of resist patterns formed using the positive radiation-sensitive resin compositions for ArF exposure were evaluated according to the following methods. The results are shown in the following Table 7. It is to be noted that a scanning electron microscope ("CG-5000" manufactured by Hitachi High-Tech Corporation) was used for measurement of the resist pattern.

[Sensitivity]

An exposure dose at which a 40 nm line-and-space pattern was formed in formation of a resist pattern using the positive radiation-sensitive resin composition for ArF exposure was defined as an optimum exposure dose, and this optimum exposure dose was defined as sensitivity (mJ/cm$^2$). A case where the sensitivity was 20 mJ/cm$^2$ or less was evaluated as "good", and a case where the sensitivity exceeded 20 mJ/cm$^2$ was evaluated as "poor".

[Lwr Performance]

A resist pattern was formed with the mask size adjusted so as to form a 40 nm line-and-space pattern by irradiation with the optimum exposure dose obtained in the evaluation of the sensitivity. The formed resist pattern was observed from above the pattern using the scanning electron microscope. The variation in line width was measured at 500 points in total, the value of 3σ was obtained from the distribution of the measured values, and the value of 3σ was defined as LWR (nm). A smaller value of LWR indicates smaller roughness of the line and better performance. A case where the LWR performance was 2.5 nm or less was evaluated as "good", and a case where the LWR performance exceeded 2.5 nm was evaluated as "poor".

[Pattern Rectangularity]

The 40 nm line-and-space pattern formed by irradiation with the optimum exposure amount obtained in the evaluation of the sensitivity was observed using the scanning electron microscope, and the cross-sectional shape of the line-and-space pattern was evaluated. The rectangularity of the resist pattern was evaluated as "good" when the ratio of the length of a lower side to the length of an upper side in the cross-sectional shape was 1 or more and 1.05 or less, "average" when the ratio was more than 1.05 and 1.10 or less, and "poor" when the ratio was more than 1.10.

TABLE 7

| | Radiation-sensitive resin composition | Sensitivity (mJ/cm$^2$) | LWR (nm) | Pattern rectangularity |
|---|---|---|---|---|
| Example 1 | J-1 | 17 | 2.1 | ○ |
| Example 2 | J-2 | 18 | 2.3 | ○ |
| Example 3 | J-3 | 17 | 2.2 | ○ |
| Example 4 | J-4 | 16 | 2.0 | ○ |
| Example 5 | J-5 | 18 | 2.1 | ○ |
| Example 6 | J-6 | 19 | 2.1 | ○ |
| Example 7 | J-7 | 16 | 2.2 | ○ |
| Example 8 | J-8 | 16 | 2.4 | ○ |
| Example 9 | J-9 | 17 | 2.1 | ○ |
| Example 10 | J-10 | 15 | 2.3 | ○ |
| Example 11 | J-11 | 16 | 2.2 | ○ |
| Example 12 | J-12 | 17 | 2.2 | ○ |
| Example 13 | J-13 | 18 | 2.0 | ○ |
| Example 14 | J-14 | 18 | 2.4 | ○ |
| Example 15 | J-15 | 19 | 2.3 | ○ |
| Example 16 | J-16 | 18 | 2.3 | ○ |
| Example 17 | J-17 | 17 | 2.2 | ○ |
| Example 18 | J-18 | 18 | 2.1 | ○ |
| Example 19 | J-19 | 18 | 2.3 | ○ |
| Example 20 | J-20 | 17 | 2.1 | ○ |
| Example 21 | J-21 | 15 | 2.3 | ○ |
| Example 22 | J-22 | 15 | 2.3 | ○ |
| Example 23 | J-23 | 18 | 2.0 | ○ |
| Example 24 | J-24 | 16 | 2.1 | ○ |
| Example 25 | J-25 | 17 | 2.0 | ○ |
| Example 26 | J-26 | 18 | 2.4 | ○ |
| Example 27 | J-27 | 18 | 2.4 | ○ |
| Example 28 | J-28 | 17 | 2.0 | ○ |
| Example 29 | J-29 | 17 | 2.2 | ○ |
| Example 30 | J-30 | 17 | 2.1 | ○ |
| Example 31 | J-31 | 18 | 2.1 | ○ |
| Example 32 | J-32 | 17 | 2.1 | ○ |
| Example 33 | J-33 | 17 | 2.0 | ○ |
| Example 34 | J-34 | 18 | 2.2 | ○ |
| Example 35 | J-35 | 18 | 2.0 | ○ |
| Example 36 | J-36 | 17 | 2.1 | ○ |
| Example 37 | J-37 | 17 | 2.1 | ○ |
| Example 38 | J-38 | 17 | 2.2 | ○ |
| Comparative Example 1 | CJ-1 | 25 | 2.8 | X |
| Comparative Example 2 | CJ-2 | 24 | 3.0 | X |
| Comparative Example 3 | CJ-3 | 22 | 3.1 | X |
| Comparative Example 4 | CJ-4 | 26 | 2.7 | X |
| Comparative Example 5 | CJ-5 | 25 | 2.9 | Δ |
| Comparative Example 6 | CJ-6 | 22 | 2.9 | X |
| Comparative Example 7 | CJ-7 | 23 | 2.8 | X |
| Comparative Example 8 | CJ-8 | 23 | 2.7 | X |
| Comparative Example 9 | CJ-9 | 25 | 3.1 | Δ |
| Comparative Example 10 | CJ-10 | 24 | 2.6 | X |
| Comparative Example 11 | CJ-11 | 22 | 2.8 | X |
| Comparative Example 12 | CJ-12 | 23 | 2.7 | Δ |

As is apparent from the results in Table 7, the radiation-sensitive resin compositions of Examples were superior in sensitivity, LWR performance, and pattern rectangularity when used for ArF exposure, whereas the radiation-sensitive resin compositions of Comparative Examples were inferior in each characteristic to Examples. Therefore, when the radiation-sensitive resin compositions of Examples were used for ArF exposure, a resist pattern having high sensitivity and superior LWR performance and pattern rectangularity can be formed.

[Preparation of Positive Radiation-Sensitive Resin Composition for Extreme Ultraviolet (EUV) Exposure]

Example 39

100 parts by mass of (A-33) as the resin [A], 12.0 parts by mass of (B-4) as the radiation-sensitive acid generator [B], 6.0 parts by mass of (C-1) as the acid diffusion controlling agent [C], 5.0 parts by mass of (E-4) as the high fluorine content resin [E], and 6,110 parts by mass of a mixed solvent of (D-1)/(D-4) as the solvent [D] were mixed, and the mixture was filtered through a membrane filter having a pore size of 0.2 μm to prepare a radiation-sensitive resin composition (J-39).

Examples 40 to 50 and Comparative Examples 13 to 15

Radiation-sensitive resin compositions (J-40) to (J-50) and (CJ-13) to (CJ-15) were prepared in the same manner as in Example 39 except that the components of the types and contents shown in the following Table 8 were used.

formed at 120° C. for 60 seconds. Thereafter, the resist film was subjected to alkaline development using a 2.38 mass % aqueous TMAH solution as an alkaline developer, and after the development, the resist film was washed with water and further dried to form a positive resist pattern (32 nm line-and-space pattern).

<Evaluation>

The sensitivity, LWR performance and pattern rectangularity of each of resist patterns formed using the positive radiation-sensitive resin compositions for EUV exposure were evaluated according to the following methods. The results are shown in the following Table 9. It is to be noted that a scanning electron microscope ("CG-5000" manufactured by Hitachi High-Tech Corporation) was used for measurement of the resist pattern.

[Sensitivity]

In formation of the resist pattern using the positive radiation-sensitive resin composition for EUV exposure, an exposure dose at which a 32 nm line-and-space pattern was formed was defined as an optimum exposure dose, and this optimum exposure dose was defined as sensitivity (mJ/cm$^2$).

TABLE 8

| | Radiation-sensitive resin composition | Resin [A] Type | Content (parts by mass) | Radiation-sensitive acid generator [B] Type | Content (parts by mass) | Acid diffusion controlling agent [C] Type | Content (parts by mass) | High fluorine content resin [E] Type | Content (parts by mass) | Solvent [D] Type | Content (parts by mass) |
|---|---|---|---|---|---|---|---|---|---|---|---|
| Example 39 | J-39 | A-33 | 100 | B-4 | 12.0 | C-1 | 6.0 | E-4 | 5.0 | D-1/D-4 | 4280/1830 |
| Example 40 | J-40 | A-33 | 100 | B-4 | 12.0 | C-1 | 6.0 | E-4 | 5.0 | D-1/D-4 | 4280/1830 |
| Example 41 | J-41 | A-33 | 100 | B-4 | 12.0 | C-1 | 6.0 | E-4 | 5.0 | D-1/D-4 | 4280/1830 |
| Example 42 | J-42 | A-33 | 100 | B-4 | 12.0 | C-1 | 6.0 | E-4 | 5.0 | D-1/D-4 | 4280/1830 |
| Example 43 | J-43 | A-33 | 100 | B-4 | 12.0 | C-1 | 6.0 | E-4 | 5.0 | D-1/D-4 | 4280/1830 |
| Example 44 | J-44 | A-33 | 100 | B-4 | 12.0 | C-1 | 6.0 | E-4 | 5.0 | D-1/D-4 | 4280/1830 |
| Example 45 | J-45 | A-33 | 100 | B-4 | 12.0 | C-1 | 6.0 | E-4 | 5.0 | D-1/D-4 | 4280/1830 |
| Example 46 | J-46 | A-33 | 100 | B-4 | 12.0 | C-1 | 6.0 | E-4 | 5.0 | D-1/D-4 | 4280/1830 |
| Example 47 | J-47 | A-33 | 100 | B-4 | 12.0 | C-1 | 6.0 | E-4 | 5.0 | D-1/D-4 | 4280/1830 |
| Example 48 | J-48 | A-33 | 100 | B-4 | 12.0 | C-1 | 6.0 | E-4 | 5.0 | D-1/D-4 | 4280/1830 |
| Example 49 | J-49 | A-33 | 100 | B-4 | 12.0 | C-1 | 6.0 | E-4 | 5.0 | D-1/D-4 | 4280/1830 |
| Example 50 | J-50 | A-33 | 100 | B-4 | 12.0 | C-1 | 6.0 | E-4 | 5.0 | D-1/D-4 | 4280/1830 |
| Comparative Example 13 | CJ-13 | A-37 | 100 | B-4 | 12.0 | C-1 | 6.0 | E-4 | 5.0 | D-1/D-4 | 4280/1830 |
| Comparative Example 14 | CJ-14 | A-38 | 100 | B-4 | 12.0 | C-1 | 6.0 | E-4 | 5.0 | D-1/D-4 | 4280/1830 |
| Comparative Example 15 | CJ-15 | A-39 | 100 | B-4 | 12.0 | C-1 | 6.0 | E-4 | 5.0 | D-1/D-4 | 4280/1830 |

<Formation of Resist Pattern Using Positive Radiation-Sensitive Resin Composition for EUV Exposure>

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The positive radiation-sensitive resin composition for EUV exposure prepared above was applied onto the underlayer antireflective film using the spin coater, and subjected to PB at 130° C. for 60 seconds. Thereafter, cooling was performed at 23° C. for 30 seconds to form a resist film having an average thickness of 55 nm. Subsequently, this resist film was exposed with an EUV exposure apparatus ("NXE3300" manufactured by ASML Holding N.V.) with an NA of 0.33 under an illumination condition of conventional illumination (s=0.89), and with a mask of imecDEFECT32FFR02. After the exposure, PEB was performed.

A case where the sensitivity was 25 mJ/cm$^2$ or less was evaluated as "good", and a case where the sensitivity exceeded 25 mJ/cm$^2$ was evaluated as "poor".

[Lwr Performance]

A resist pattern was formed with the mask size adjusted so as to form a 32 nm line-and-space pattern by irradiation with the optimum exposure dose obtained in the evaluation of the sensitivity. The formed resist pattern was observed from above the pattern using the scanning electron microscope. The variation in line width was measured at 500 points in total, the value of 3σ was obtained from the distribution of the measured values, and the value of 3σ was defined as LWR (nm). A smaller value of LWR indicates smaller displacement of the line and better performance. A case where the LWR performance was 3.0 nm or less was evaluated as "good", and a case where the LWR performance exceeded 3.0 nm was evaluated as "poor".

[Pattern Rectangularity]

The 32 nm line-and-space pattern formed by irradiation with the optimum exposure amount obtained in the evaluation of the sensitivity was observed using the scanning electron microscope, and the cross-sectional shape of the line-and-space pattern was evaluated. The rectangularity of the resist pattern was evaluated as "good" when the ratio of the length of a lower side to the length of an upper side in the cross-sectional shape was 1 or more and 1.05 or less, "average" when the ratio was more than 1.05 and 1.10 or less, and "poor" when the ratio was more than 1.10.

TABLE 9

| | Radiation-sensitive resin composition | Sensitivity (mJ/cm$^2$) | LWR (nm) | Pattern rectangularity |
|---|---|---|---|---|
| Example 39 | J-39 | 22 | 2.5 | ○ |
| Example 40 | J-40 | 23 | 2.6 | ○ |
| Example 41 | J-41 | 21 | 2.7 | ○ |
| Example 42 | J-42 | 21 | 2.7 | ○ |
| Example 43 | J-43 | 19 | 2.6 | ○ |
| Example 44 | J-44 | 20 | 2.7 | ○ |
| Example 45 | J-45 | 23 | 2.5 | ○ |
| Example 46 | J-46 | 21 | 2.4 | ○ |
| Example 47 | J-47 | 20 | 2.6 | ○ |
| Example 48 | J-48 | 24 | 2.8 | ○ |
| Example 49 | J-49 | 21 | 2.7 | ○ |
| Example 50 | J-50 | 20 | 2.6 | ○ |
| Comparative Example 13 | CJ-13 | 28 | 3.3 | X |
| Comparative Example 14 | CJ-14 | 29 | 3.4 | X |
| Comparative Example 15 | CJ-15 | 29 | 3.3 | X |

As is apparent from the results in Table 9, the radiation-sensitive resin compositions of Examples were superior in sensitivity, LWR performance and pattern rectangularity when used for EUV exposure, whereas the radiation-sensitive resin compositions of Comparative Examples were inferior in characteristics to those of Examples.

[Preparation of Negative Radiation-Sensitive Resin Composition for ArF Exposure, and Formation and Evaluation of Resist Pattern Using this Composition]

Example 51

100 parts by mass of (A-3) as the resin [A], 15.0 parts by mass of (B-3) as the radiation-sensitive acid generator [B], 8.0 parts by mass of (C-2) as the acid diffusion controlling agent [C], 2.0 parts by mass (solid content) of (E-3) as the high fluorine content resin [E], and 3,230 parts by mass of a mixed solvent of (D-1)/(D-2)/(D-3) (2240/960/30) as the solvent [D] were mixed, and the mixture was filtered through a membrane filter having a pore size of 0.2 μm to prepare a radiation-sensitive resin composition (J-51).

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The negative radiation-sensitive resin composition for ArF exposure (J-51) prepared above was applied onto the underlayer antireflective film using the spin coater, and subjected to PB (prebake) at 90° C. for 60 seconds. Thereafter, cooling was performed at 23° C. for 30 seconds to form a resist film having an average thickness of 90 nm. Subsequently, this resist film was exposed through a mask pattern of 40 nm space and 105 nm pitch using an ArF excimer laser immersion exposure apparatus ("TWINSCAN XT-1900i" manufactured by ASML Holding N.V.) under optical conditions of a numeral aperture (NA) of 1.35 and annular illumination (σ=0.8/0.6). After the exposure, PEB (post exposure bake) was performed at 90° C. for 60 seconds. Thereafter, the resist film was developed with n-butyl acetate as an organic solvent developer, and dried to form a negative resist pattern (40 nm line-and-space pattern).

The resist pattern using the negative radiation-sensitive resin composition for ArF exposure was evaluated in the same manner as in the evaluation of the resist pattern using the positive radiation-sensitive resin composition for ArF exposure. As a result, the radiation-sensitive resin composition of Example 51 was superior in sensitivity, LWR performance, and pattern rectangularity even when a negative resist pattern was formed by ArF exposure.

[Preparation of Negative Radiation-Sensitive Resin Composition for EUV Exposure, and Formation and Evaluation of Resist Pattern Using this Composition]

Example 52

100 parts by mass of (A-33) as the resin [A], 20.0 parts by mass of (B-4) as the radiation-sensitive acid generator [B], 12.0 parts by mass of (C-1) as the acid diffusion controlling agent [C], 2.0 parts by mass of (E-4) as the high fluorine content resin [E], and 6,110 parts by mass of a mixed solvent of (D-1)/(D-4)=70/30 (mass ratio) as the solvent [D] were mixed, and the mixture was filtered through a membrane filter having a pore size of 0.2 μm to prepare a radiation-sensitive resin composition (J-52).

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The negative radiation-sensitive resin composition for EUV exposure (J-64) prepared above was applied onto the underlayer antireflective film using the spin coater, and subjected to PB at 130° C. for 60 seconds. Thereafter, cooling was performed at 23° C. for 30 seconds to form a resist film having an average thickness of 55 nm. Subsequently, this resist film was exposed with an EUV exposure apparatus ("NXE3300" manufactured by ASML Holding N.V.) with an NA of 0.33 under an illumination condition of conventional illumination (s=0.89), and with a mask of imecDEFECT32FFR02. After the exposure, PEB was performed at 120° C. for 60 seconds. Thereafter, the resist film was developed with n-butyl acetate as an organic solvent developer, and dried to form a negative resist pattern (32 nm line-and-space pattern).

The resist pattern using the negative radiation-sensitive resin composition for EUV exposure was evaluated in the same manner as in the evaluation of the resist pattern using the positive radiation-sensitive resin composition for EUV exposure. As a result, the radiation-sensitive resin composition of Example 52 was superior in sensitivity, LWR performance and pattern rectangularity even when a negative resist pattern was formed by EUV exposure.

According to the radiation-sensitive resin composition and the resist pattern forming method of the embodiments of the present invention, a resist pattern that is superior in sensitivity to exposure light and excellent in LWR performance and pattern rectangularity can be formed. Therefore, these can be suitably used for a processing process of a semiconductor device in which micronization is expected to further progress in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
a resin comprising a structural unit (A) represented by formula (1) and a structural unit (B) having an acid-dissociable group;
a radiation-sensitive acid generator; and
a solvent,

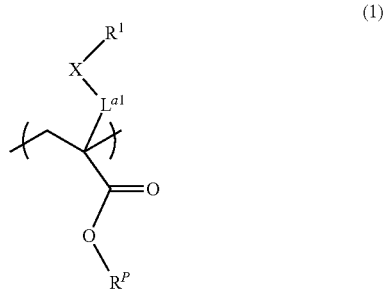

(1)

wherein
$R^1$ is a halogen atom-substituted or unsubstituted monovalent hydrocarbon group having 1 to 20 carbon atoms, the monovalent hydrocarbon group not including a sulfur atom,
X is —O— or —S—,
$L^{a1}$ is a halogen atom-substituted or unsubstituted divalent hydrocarbon group having 1 to 10 carbon atoms, and
$R^P$ is a monovalent organic group having at least one structure selected from the group consisting of a cyclic carbonate structure and a sultone structure.

2. The radiation-sensitive resin composition according to claim 1, wherein $R^1$ is a halogen atom-substituted or unsubstituted monovalent chain hydrocarbon group, a halogen atom-substituted or unsubstituted alicyclic hydrocarbon group, or a halogen atom-substituted or unsubstituted aromatic hydrocarbon group.

3. The radiation-sensitive resin composition according to claim 1, wherein $L^{a1}$ in the formula (1) is a divalent chain hydrocarbon group.

4. The radiation-sensitive resin composition according to claim 3, wherein $L^{a1}$ in the formula (1) is a methylene group.

5. The radiation-sensitive resin composition according to claim 1, wherein $R^P$ in the formula (1) is represented by formula (A):

(A)

wherein
$L^{a2}$ is a single bond or a substituted or unsubstituted divalent hydrocarbon group having 1 to 10 carbon atoms,
Y is a single bond or a divalent linking group which is —O—, —CO—, —NH—, —SO_2—, or a combination thereof,
$L^{a3}$ is a single bond or a substituted or unsubstituted divalent hydrocarbon group having 1 to 10 carbon atoms,
$R^{P1}$ is a substituted or unsubstituted cyclic carbonate structure or a substituted or unsubstituted sultone structure, and
* is a bond with —O— in the above formula (1).

6. The radiation-sensitive resin composition according to claim 1, wherein the resin has a fluorine content of 10% by mass or less.

7. The radiation-sensitive resin composition according to claim 1, wherein a content of the structural unit (A) in the resin is 5 mol % or more and 80 mol % or less with respect to all structural units constituting the resin.

8. The radiation-sensitive resin composition according to claim 1, wherein the resin further comprises a structural unit (C) which is not a structural unit corresponding to the structural unit (A) and which comprises at least one structure selected from the group consisting of a lactone structure, a cyclic carbonate structure, and a sultone structure.

9. The radiation-sensitive resin composition according to claim 1, wherein the resin comprises two or more kinds of the structural unit (B) in combination.

10. The radiation-sensitive resin composition according to claim 1, wherein the structural unit (B) in the resin is represented by formula (3-1):

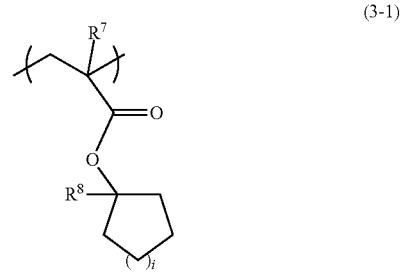

(3-1)

wherein
$R^7$ is a hydrogen atom, a fluorine atom, a methyl group or a trifluoromethyl group,
$R^8$ is a monovalent hydrocarbon group having 1 to 20 carbon atoms, and
i is an integer of 1 to 4.

11. A method for forming a resist pattern, comprising:
forming a resist film from the radiation-sensitive resin composition according to claim 1;
exposing the resist film; and
developing the exposed resist film.

12. The method according to claim 11, further comprising providing an upper film on the resist film after forming the resist film and before exposing the resist film.

13. The method according to claim 11, wherein $R^1$ is a halogen atom-substituted or unsubstituted monovalent chain hydrocarbon group, a halogen atom-substituted or unsubstituted alicyclic hydrocarbon group, or a halogen atom-substituted or unsubstituted aromatic hydrocarbon group.

14. The method according to claim 11, wherein $L^{a1}$ in the formula (1) is a divalent chain hydrocarbon group.

15. The method according to claim 11, wherein $R^P$ in the formula (1) is represented by formula (A):

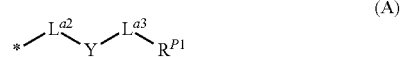

(A)

wherein

L$^{a2}$ is a single bond or a substituted or unsubstituted divalent hydrocarbon group having 1 to 10 carbon atoms, Y is a single bond or a divalent linking group which is —O—, —CO—, —NH—, —SO$_2$—, or a combination thereof, L$^{a3}$ is a single bond or a substituted or unsubstituted divalent hydrocarbon group having 1 to 10 carbon atoms, R$^{P1}$ is a substituted or unsubstituted cyclic carbonate structure or a substituted or unsubstituted sultone structure, and

* is a bond with —O— in the above formula (1).

16. The radiation-sensitive resin composition according to claim 1, wherein the monovalent hydrocarbon group represented by R$^1$ in the formula (1) does not include a hetero atom other than a halogen atom.

17. The radiation-sensitive resin composition according to claim 1, wherein a content of the structural unit (A) in the resin is 6 mol % or more and 70 mol % or less with respect to all structural units constituting the resin.

18. The radiation-sensitive resin composition according to claim 1, wherein a content of the structural unit (A) in the resin is 8 mol % or more and 60 mol % or less with respect to all structural units constituting the resin.

19. The radiation-sensitive resin composition according to claim 1, wherein a content of the structural unit (B) in the resin is 10 mol % or more and 90 mol % or less with respect to all structural units constituting the resin.

20. The radiation-sensitive resin composition according to claim 1, wherein a content of the structural unit (B) in the resin is 25 mol % or more and 70 mol % or less with respect to all structural units constituting the resin.

* * * * *